United States Patent

Nakai et al.

[11] Patent Number: 5,805,512
[45] Date of Patent: Sep. 8, 1998

[54] SEMICONDUCTOR MEMORY DEVICE

[75] Inventors: Chikahiro Nakai; Hiroyuki Koinuma, both of Yokohama, Japan

[73] Assignee: Kabushiki Kaisha Toshiba, Tokyo, Japan

[21] Appl. No.: 598,748

[22] Filed: Feb. 8, 1996

[30] Foreign Application Priority Data

Feb. 9, 1995 [JP] Japan .................................. 7-022122

[51] Int. Cl.⁶ ...................................................... G11C 7/00
[52] U.S. Cl. .................. 365/200; 365/225.7; 365/230.03
[58] Field of Search .............................. 365/200, 230.03, 365/225.7, 230.02, 230.06

[56] References Cited

U.S. PATENT DOCUMENTS

| | | |
|---|---|---|
| 5,033,024 | 7/1991 | O'Connell et al. ..................... 365/200 |
| 5,293,348 | 3/1994 | Abe ...................................... 365/230.03 |
| 5,325,334 | 6/1994 | Roh et al. ................................ 365/200 |
| 5,416,740 | 5/1995 | Fujita et al. ............................ 365/200 |
| 5,495,447 | 2/1996 | Butler et al. ........................ 365/230.03 |
| 5,519,657 | 5/1996 | Arimoto .................................. 365/200 |
| 5,581,508 | 12/1996 | Sasaki et al. ........................... 365/200 |

*Primary Examiner*—Tan T. Nguyen
*Attorney, Agent, or Firm*—Loeb & Loeb LLP

[57] ABSTRACT

A semiconductor memory device has one redundant memory cell block selection fuse circuit block for replacing a plurality of normal memory cell blocks with one or more redundant memory cell blocks. The number of the redundant memory cell block selection fuse circuit blocks is thereby reduced enough to restrain an increase in chip area. A lesser number of normal word lines than the number of normal word lines possessed by one normal memory cell block controlled by one normal decoder are set as a minimum replace unit, and a degree of replacing freedom can be improved.

24 Claims, 27 Drawing Sheets

SEMICONDUCTOR MEMORY DEVICE

BACKGROUND OF THE INVENTION

The present invention relates generally to a semiconductor memory device and, more particularly, to a semiconductor memory device such as a dynamic RAM having a redundant structure.

In the semiconductor memory device, it has been practiced that if a normal memory cell has flaws and becomes defective, this defective memory cell is replaced with a redundant memory cell prepared beforehand to save and make the device perfect. This technology is indispensable for enhancing the yield of the device. Efficient saving is an important point in terms of enhancing the yield and reducing the costs.

According to a generally-known method of replacing the defective memory cell, if the normal memory cell of a certain block in a memory cell array constructed of a plurality of memory cell blocks divided corresponding to addresses has the flaws and becomes defective, the whole block including this defective memory cell is replaced with a redundant memory cell block.

A semiconductor memory device adopting the method of replacing the defective memory cell according to the prior art will hereinafter be described with reference to FIG. 12, FIG. 13, FIG. 14, FIG. 15 and FIG. 16.

FIG. 12 is a block diagram illustrating the conventional semiconductor memory device. FIG. 13 is circuit diagram of a redundant memory cell block selection fuse circuit block FB00 in FIG. 12. Redundant memory cell block selection fuse circuit blocks FB01, FB10, FB11, . . . , FB31 have the same configuration as the redundant memory cell block selection fuse circuit block FB00. FIG. 14 is a circuit diagram of a redundant decoder SDEC00, wherein redundant decoders SDEC01, SDEC10, SDEC11, . . . , SDEC31 have the same configuration as the redundant decoder SDEC00. FIG. 15 is a circuit diagram of a normal decoder control circuit NDC0 in FIG. 12, wherein normal decoder control circuits NDC1–NDC3 have the same configuration as the normal decoder control circuit NDC0. FIG. 16 is a circuit diagram of a normal decoder NDEC00, wherein normal decoders NDEC01–NDEC0n, NDEC10–NDEC1n, NDEC20–NDEC2n, NDEC30–NDEC3n have the same configuration as the normal decoder NDEC00.

Referring to FIG. 12, FIG. 13, FIG. 14, FIG. 15 and FIG. 16, MCA0 is a memory cell array and it includes normal memory cell blocks NCB00–NCB0n and redundant memory cell blocks SCB00 and SCB01. Other memory cell arrays MCA1–MCA3 have the same configuration as the memory cell array MCA0. Shown therein are redundant memory cell block selection fuse circuit blocks FB00, FB01, FB10, FB11, FB31, redundant decoders SDEC00, SDEC01, SDEC10, SDEC11, . . . , SDEC31, normal decoders NDEC00–NDEC0n, NDEC10–NDEC1n, NDEC20–NDEC2n, NDEC30–NDEC3n, normal decoder control circuits NDC0–NDC3, address signals XA0–XA3, XB0–XB3, XC0–XC3, memory cell array selecting signals RSL0–RSL3, word line drive signals WDRV0–WDRV3, normal word line drive signals WDRV00–WDRV03, WDRV10–WDRV13, WDRV20–WDRV23, WDRV30–WDRV33, normal word lines WL00, WL01, WL02, WL03, . . . , redundant word lines SWL00, SWL01, SWL02, SWL03, SWL04, SWL05, SWL06, SWL07, redundancy indicating signals RSP00, RSP10, RSP11, . . . , RSP31, a signal PRCH, a power supply voltage VCC, a ground voltage VSS, P-type MOS transistors QP0–QP1, N-type MOS transistors QN0–QN47 and fuses FU0–FU11.

According to such a prior art, each memory cell array is provided with a plurality of normal memory cell blocks each having four normal word lines and with two redundant memory cell blocks each having four redundant word lines. For selecting those redundant memory cell blocks, each redundant memory cell block includes the redundant memory cell block selection fuse circuit block. For example, the memory cell array MCA0 is provided with the redundant memory cell block selection fuse circuit blocks FB00, FB01 for the two redundant memory cell blocks SCB00, SCB01 in order to replace the normal memory cell blocks NCB00–NCB0n. Further, each normal decoder provided for one normal memory cell block controls four normal word lines connected to each normal memory cell block. Each redundant decoder provided for one redundant memory cell block controls four redundant word lines connected to each redundant memory cell block. The word line drive signals WDRV0–WDRV3 are partially decoded by a least significant bit A0R in a row address and a bit A1R that is just higher-order than A0R, and one of them is selected by a logic voltage of each of A0R, A1R, thus obtaining a predetermined word line potential. The arrangement is such that the address signals XA0–XA3 are partially decoded by high-order bits A2R, A3R; the address signals XB0–XB3 are partially decoded by higher-order bits A4R, A5R; and the address signals XC0–XC3 are partially decoded by much higher-order bits A6R, A7R.

The memory cell arrays are selected by the memory cell array selecting signals RSL0–RSL3. The normal memory cell blocks in the single memory cell array are selected by selecting the normal decoders with the address signals XA0–XA3, XB0–XB3, XC0–XC3. The normal word lines in the selected memory cell blocks are selected by the normal word line drive signals WDRV00–WDRV03, WDRV10–WDRV13, WDRV20–WDRV23, WDRV30–WDRV33 that are obtained when the word line drive signals WDRV0–WDRV3 are connected via the normal decoder control circuits to the respective normal decoders.

Based on the construction of the prior art described above, for example, if one normal memory cell block including defective memory cells exists in the normal memory cell block provided in the memory cell array MCA0, and when making an attempt to replace it with one of the redundant memory cell blocks SCB00, SCB01, a fuse corresponding to an address of the block containing the defective memory cell is disconnected by one of the redundant memory cell block selection fuse circuit blocks FB00, FB01. As a result, the block containing the defective memory cell is replaced with the redundant memory cell block corresponding to the redundant memory cell block selection fuse circuit block which has disconnected the fuse, and that redundant memory cell block is used. Further, if there are prepared two normal memory cell blocks containing defective memory cells, and when using two redundant memory cell blocks SCB00, SCB01 for the replacement, the fuses corresponding to respective addresses of the two blocks containing the defective memory cells are disconnected by the respective redundant memory cell block selection fuse circuit blocks FB00, FB01, whereby the two blocks containing defective memory cells are replaced with the redundant memory cell blocks SCB00, SCB01.

A circuit operation of the semiconductor memory device adopting a method of replacing the defective memory cell in accordance with the prior art will hereinafter be explained in detail with reference to FIGS. 13, FIG. 14 and FIG. 15.

Herein, it is assumed that the memory cell array MCA0 be selected among MCA0–MCA3. In an initial state, in the redundant memory cell block selection fuse circuit block FB00 shown in FIG. 13, the signal PRCH has a logic "LOW" (hereinafter abbreviated to "L"), the P-type MOS transistor QP0 is ON, all the address signals XA0–XA3, XB0–XB3, XC0–XC3 are "L", N-type MOS transistors QN0–QN11 are OFF, and the redundancy indicating signal RSP00 has a logic "HIGH" (hereinafter abbreviated to "H"). Further, all the memory cell array selecting signal RSL0–RSL3 are "L", all the word line drive signals WDRV0–WDRV3 are "L", and therefore the redundant word lines SWL00–SWL03 are "L" in the redundant decoder SDEC00 illustrated in FIG. 14.

To start with, the signal PRCH becomes "H", while the P-type MOS transistor QP0 is turned OFF. Subsequently, the memory cell array selecting signal RSL0 among RSL0–RSL3 that have all been initially "L" assumes "H". Further, totally three address signals, i.e.., one of the address signals XA0–XA3, one of XB0–XB3 and one of XC0–XC3 that have been all initially "L" becomes "H". When those address signals are converted into addresses of the memory cell blocks to be selected, three of twelve N-type MOS transistors QN0–QN11 are turned ON corresponding to the changes in the address signals.

At this time, if this address combination with "H" is not the combination of addresses of the blocks containing the defective memory cells in the memory cell array MCA0 and does not coincide with a combination of addresses corresponding to the fuses disconnected in any of the redundant memory cell block selection fuse circuits FB00, FB01 provided corresponding to the memory cell array MCA0, both of the redundancy indicating signal RSP00 and RSP01 become "L". Accordingly, even when the memory cell array selecting signal RSL0 becomes "H" in every one of the redundant decoders SDEC100, SDEC101 illustrated in FIG. 14, the N-type MOS transistors QN13, QN16, QN19, QN22 are OFF, while the N-type MOS transistors QN14, QN17, QN20, QN23 are ON. Hence, all the redundant word lines SWL00–SWL07 remain to be "L" even when one arbitrary signal selected among the word line drive signals WDRV0–WDRV3 becomes a predetermined word line potential. That is, neither the redundant memory cell block SCB00 nor SCB01 is selected.

However, if the above address combination with "H" is the combination of addresses of the blocks containing the defective memory cells in the memory cell array MCA0 and coincides with the combination of addresses corresponding to the fuses disconnected by the redundant memory cell block selection fuse circuit block FB00, the redundancy indicating signal RSP00 remains "H". Accordingly, when the memory cell array selecting signal RSL0 assumes "H" in the redundant decoder SDEC00 shown in FIG. 14, the N-type MOS transistors QN13, QN16, QN19, QN22 are ON, while the N-type MOS transistors QN14, QN17, QN20, QN23 are OFF. Therefore, when one arbitrary signal selected among the word line drive signals WDRV0–WDRV3 becomes a predetermined word line potential, this electric potential is transferred to the corresponding redundant word line. That is, the redundant memory cell block SCB00 is to be selected.

At this time, as explained above, the redundancy indicating signal RSP00 is "H", and, therefore, even when the memory cell array selecting signal RSL0 assumes "H" in the normal decoder control circuit NDC0 shown in FIG. 15, the N-type MOS transistors QN25, QN28, QN31, QN34 are OFF, while the N-type MOS transistors QN26, QN29, QN32, QN35 are ON. Hence, when one arbitrary signal selected among the word line drive signals WDRV0–WDRV3 becomes a predetermined word line potential, all the normal word line drive signals WDRV00–WDRV03 remain "L", and all the normal memory cell blocks NCB00–NCB0n in the memory cell array MCA0 are non-selected.

Further, if the above address combination with "H" is coincident with the combination of addresses corresponding to the fuses disconnected in the redundant memory cell block selection fuse circuit FB01, as in the case of coinciding with the combination of addresses corresponding to the fuses disconnected in the redundant memory cell block selection fuse circuit block FB60, the redundant memory cell block SCB01 is selected, and the redundancy indicating signal RSP01 remains "H". Accordingly, all the normal memory cell blocks NCB00–NCB0n of the memory cell array MCA0 are non-selected. Accordingly, it follows that the normal memory cell block selected by the address combination with "H" is replaced with the redundant memory cell block selected by the redundant memory cell block selection fuse circuit block with the disconnected fuse corresponding to that address.

Herein, on the occasion of the fuse disconnection, there are disconnected totally three fuses, i.e., one of the four fuses corresponding to the address signals XA0–XA3, one of the four fuses corresponding to XB0–XB3 and one of the four fuses corresponding to XC0–XC3 with respect to every one redundant memory cell block selection fuse circuit block.

However, the replacement with the redundant memory cell block in the semiconductor memory device according to the prior art method discussed above is limited to replacing one normal memory cell block controlled by one normal decoder with one redundant memory cell block by use of the redundant memory cell block selection fuse circuit block. Therefore, the degree of replacing freedom is low, and, a larger number of redundant memory cell block selection fuse circuit blocks are required with an increased number of redundant memory cell blocks prepared for one memory cell array to enhance the saving rate. There arises a problem in which this leads to increases both in chip area and in costs.

SUMMARY OF THE INVENTION

It is a primary object of the present invention, which was contrived in view of the problems described above, to provide a semiconductor memory device having a structure for enhancing a replacement efficiency of a redundant memory cell block by restraining a chip area from increasing.

According to a first aspect of the present invention, there is provided a semiconductor memory device comprising: a memory cell array including a plurality of normal memory cell blocks a plurality of redundant memory cell blocks; and a redundant memory cell block selection fuse circuit block for replacing plural units of normal cells with one or more redundant memory cell blocks, the one or more units of normal memory cells being controlled by the predetermined number of, at least, one or more normal word lines among the normal word lines for controlling the one normal memory cell block.

According to this construction, there is provided the redundant memory cell block selection fuse circuit block for replacing the plural units of normal memory cells with one or more redundant memory cell blocks, wherein one or more normal cells controlled by the predetermined number of, i.e., at least one or more normal word lines. Hence, it is possible to enhance both the degree of replacing freedom and a replacement efficiency of the redundant memory cell block and restrain a chip area from increasing.

According to a second aspect of the present invention, there is provided a semiconductor memory device comprising: a memory cell array including a plurality of normal memory cell blocks and a plurality of redundant memory cell blocks; a redundant memory cell block selection fuse circuit block having a plurality of fuses disconnected corresponding to addresses of a plurality of defective normal memory cell blocks in order to replace the plurality of defective normal memory cell blocks among the plurality of normal memory cell blocks with a part or all of the plurality of redundant memory cell blocks; a normal decoder for controlling accesses to the normal memory cell blocks; and a redundant decoder for controlling accesses to the redundant memory cell blocks.

According to this construction, the plurality of defective normal memory cell blocks are replaced with a part or whole of the plurality of redundant memory cell blocks by use of one redundant memory cell block selection fuse circuit block. Therefore, it is feasible to restrain the chip area from increasing while securing the degree of replacing freedom.

According to a third aspect of the present invention, there is provided a semiconductor memory device comprising; a memory cell array including a plurality of normal cell blocks and one or more redundant memory cell blocks; a redundant memory cell block selection fuse circuit block, having a plurality of fuses disconnected corresponding to addresses of defective normal memory cell blocks, to which an address that is lower-order than the least-significant address is inputted among normal memory cell block selection addresses stored, for replacing an area containing the defective normal memory cells in the defective normal memory cell block among the plurality of normal memory cell blocks with a part of or all of one or more redundant memory cell blocks; a normal decoder for controlling an access to the normal memory cell block; and a redundant decoder for controlling an access to the redundant memory cell block.

According to this construction, the area containing the defective normal memory cells in the defective normal memory cell block among the plurality of normal memory cell blocks are replaced with a part or all of one or more redundant memory cell blocks by disconnecting the plurality of fuses provided in one redundant memory cell block selection fuse circuit block, corresponding to the defective addresses of normal memory cell blocks, and by inputting the address that is lower-order than the least significant address among the stored normal memory cell block selection addresses. It is therefore possible to enhance both the degree of replacing freedom and the replace efficiency of the redundant memory cell block and also restrain the chip area from increasing.

BRIEF DESCRIPTION OF THE DRAWINGS

According to the attached drawings,

FIG. 8 is an explanatory diagram schematically showing an arrangement of addresses allocated to normal memory cell blocks in the semiconductor memory device in the second embodiment;

FIG. 9 is an explanatory diagram schematically illustrating an arrangement of addresses allocated to the normal memory blocks a prior art semiconductor memory device or in the first embodiment;

DESCRIPTION OF THE PREFERRED EMBODIMENTS

A semiconductor memory device adopting a method of replacing a defective memory cell in accordance with a first embodiment of the present invention will be described with reference to FIG. 1, FIG. 2, FIG. 3 and FIG. 4.

Figure 1:
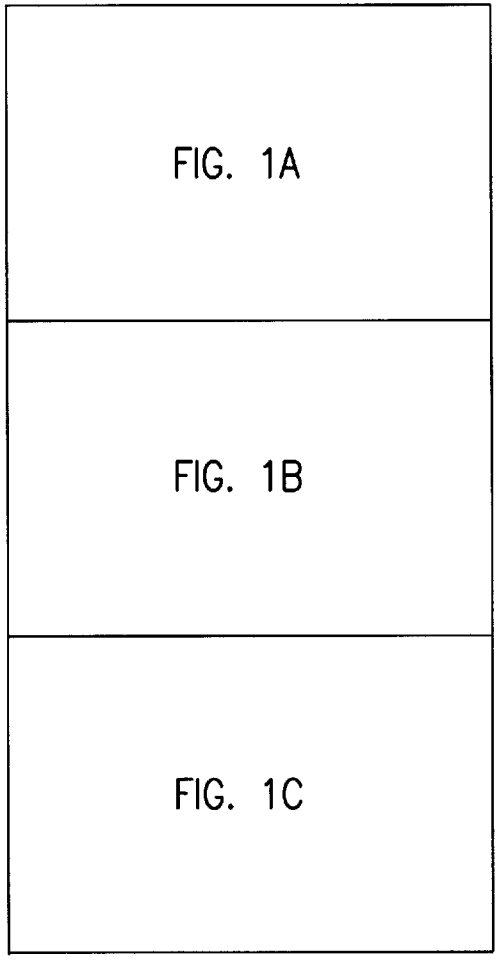
FIG. 1 is a block diagram illustrating a semiconductor memory device in accordance with a first embodiment of the present invention.
Figure 1A:
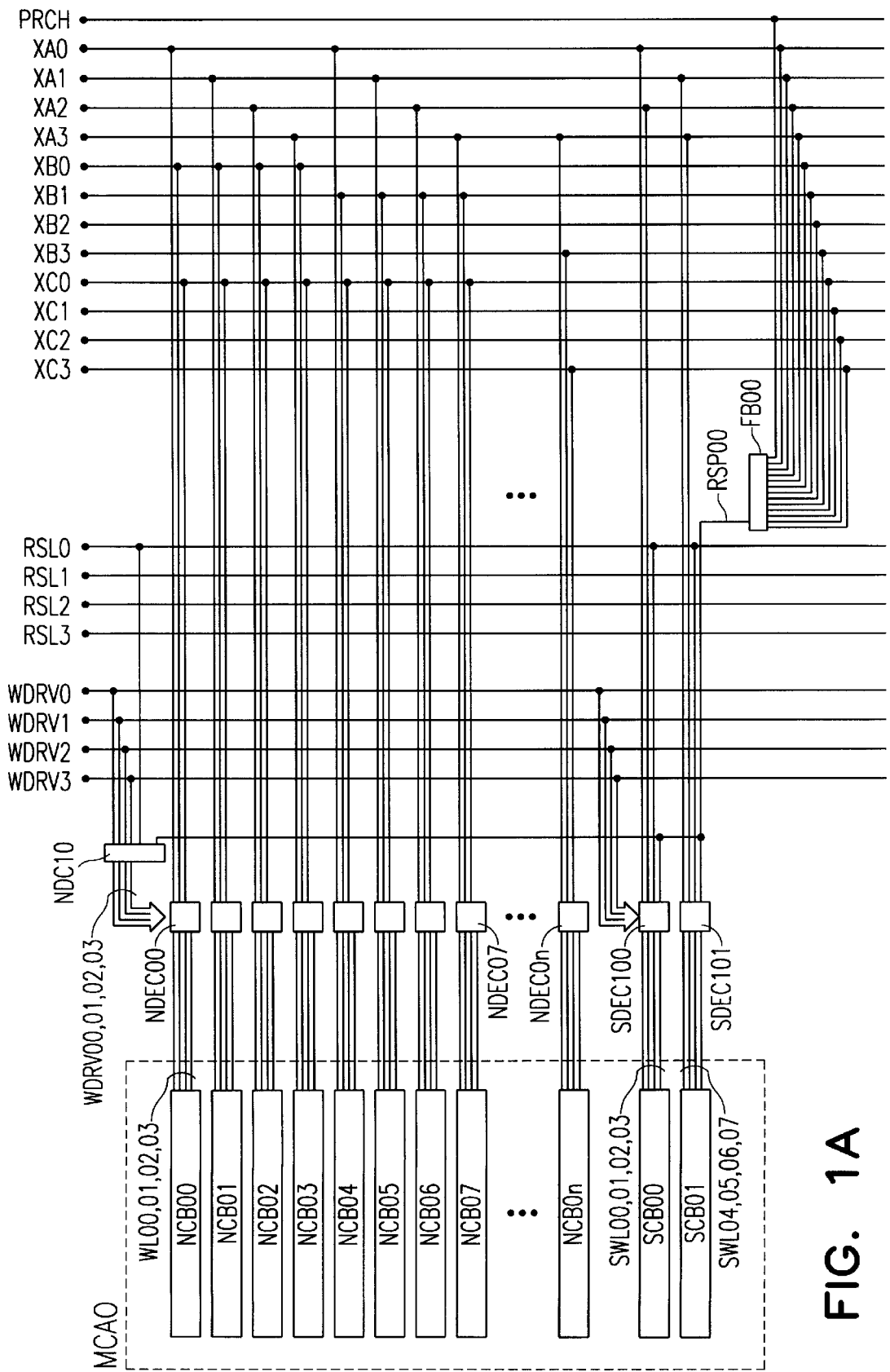
Figure 1B:
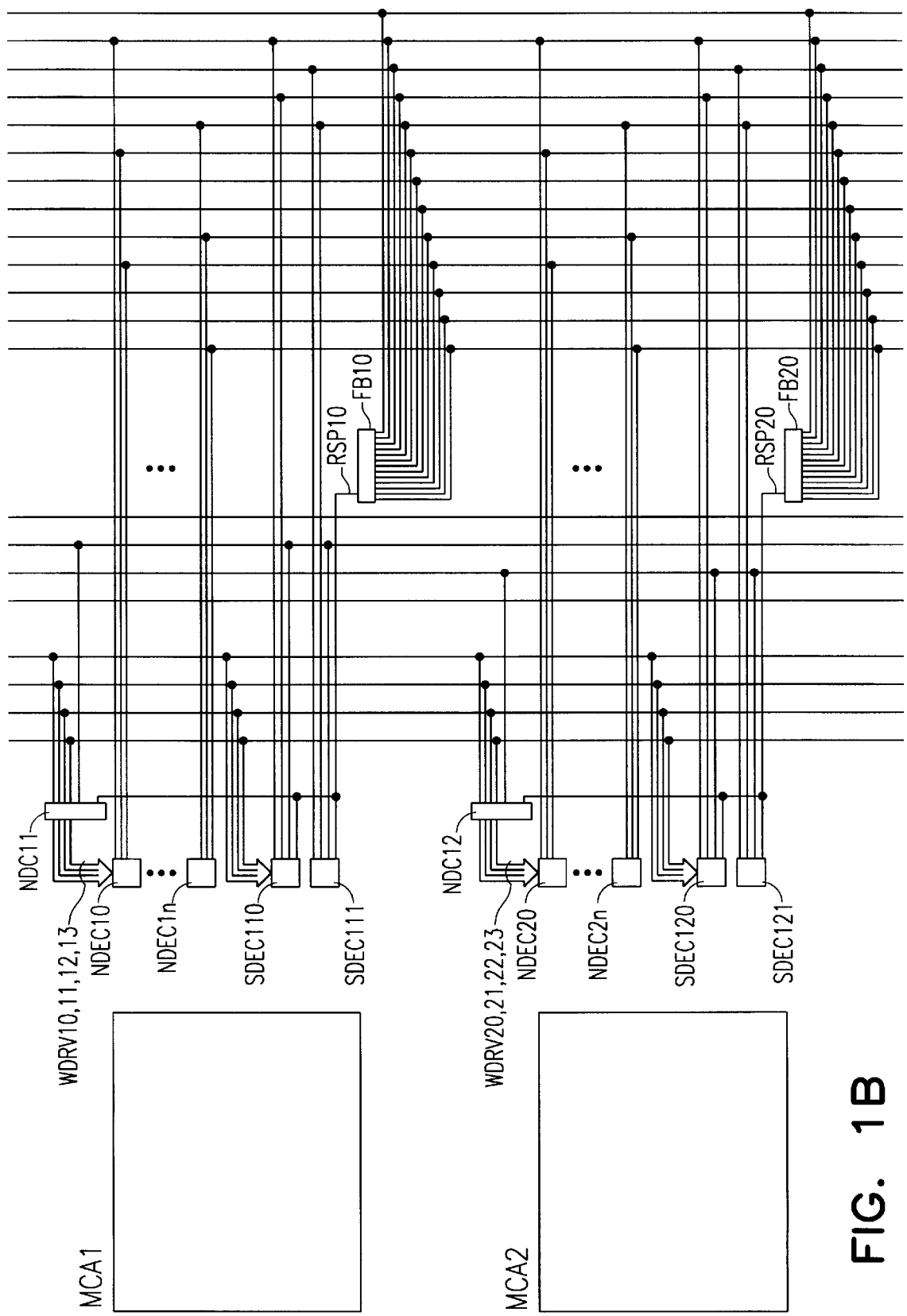
Figure 1C:
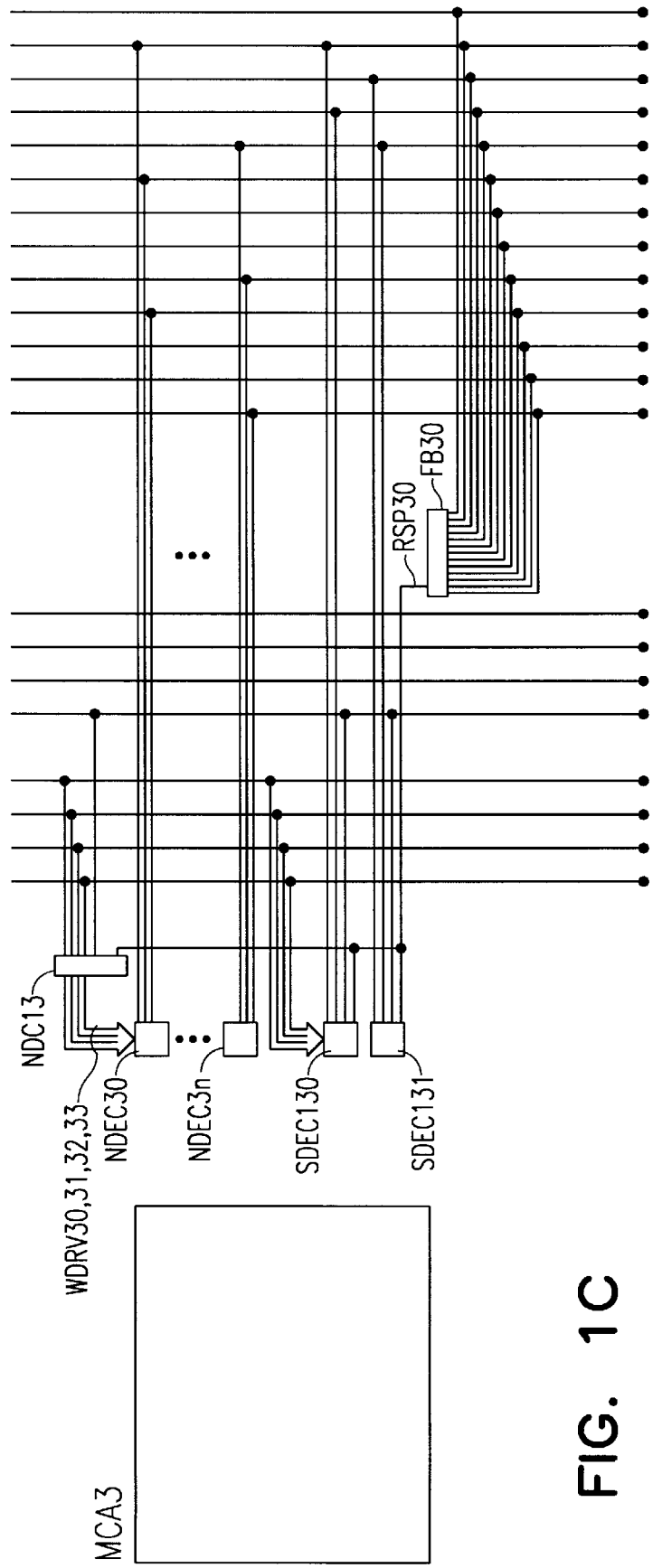

FIG. 1 is a block diagram illustrating a construction of the semiconductor memory device in accordance with the first embodiment.

Shown in the uppermost part of the block diagram of FIG. 1 is a memory cell array MCA0 including a plurality of normal memory cell blocks NCB00–NCB0$n$ and two redundant memory cell blocks SCB00, SCB01.

One end of normal word lines WL00–03 is individually connected to the normal memory cell block NCB00, while the other end of the normal word lines WL00-03 is connected to a normal decoder NDEC00. It is assumed that other normal memory cell blocks NCB01–NCB0$n$ are connected via normal word lines (marked with no symbol in the Figure) to other normal decoders NDEC01–NDEC0$n$.

Inputted to each of the normal decoders NDEC00–NDEC0$n$ are one of address signals XA0–XA3, one of XB0–XB3 and one of XC0–XC3 corresponding to addresses of the normal memory cell blocks connected via the normal word lines WL00–WL03 to the normal decoders NDEC00–NDEC0$n$. Inputted further thereto are word line drive signals WDRV00–WDRV03 transmitted from a normal decoder control circuit NDC10.

Inputted to the normal decoder control circuit NDC10 are a memory cell array selecting signal RSL0 and a redundancy indicating signal RSP00 from a redundant memory cell block selection fuse circuit block FB00.

One end of redundant word lines SWL00–SWL03, SWL04–SWL07 is individually connected to two pieces of redundant memory cell blocks SCB00, SCB01, while the other end of the redundant word lines SWL00–SWL03, SWL04–SWL07 is connected to redundant decoders SDEC100, SDEC101.

Inputted to the redundant decoder SDEC100 are word line drive signals WDRV0–WDRV3, address signals XA0, XA2, the memory cell array selecting signal RSL0 and the redundancy indicating signal RSP00 from the redundant memory cell block selection fuse circuit block FB00.

Inputted to the redundant decoder SDEC101 are the word line drive signals WDRV0–WDRV3, address signals XA1, XA3, the memory cell array selecting signal RSL0 and the redundancy indicating signal RSP00 from the redundant memory cell block selection fuse circuit block FB00.

A connecting relationship at the uppermost part of the block diagram has been explained so far, and every stage has a construction based on the same connecting relationship.

Figure 13:
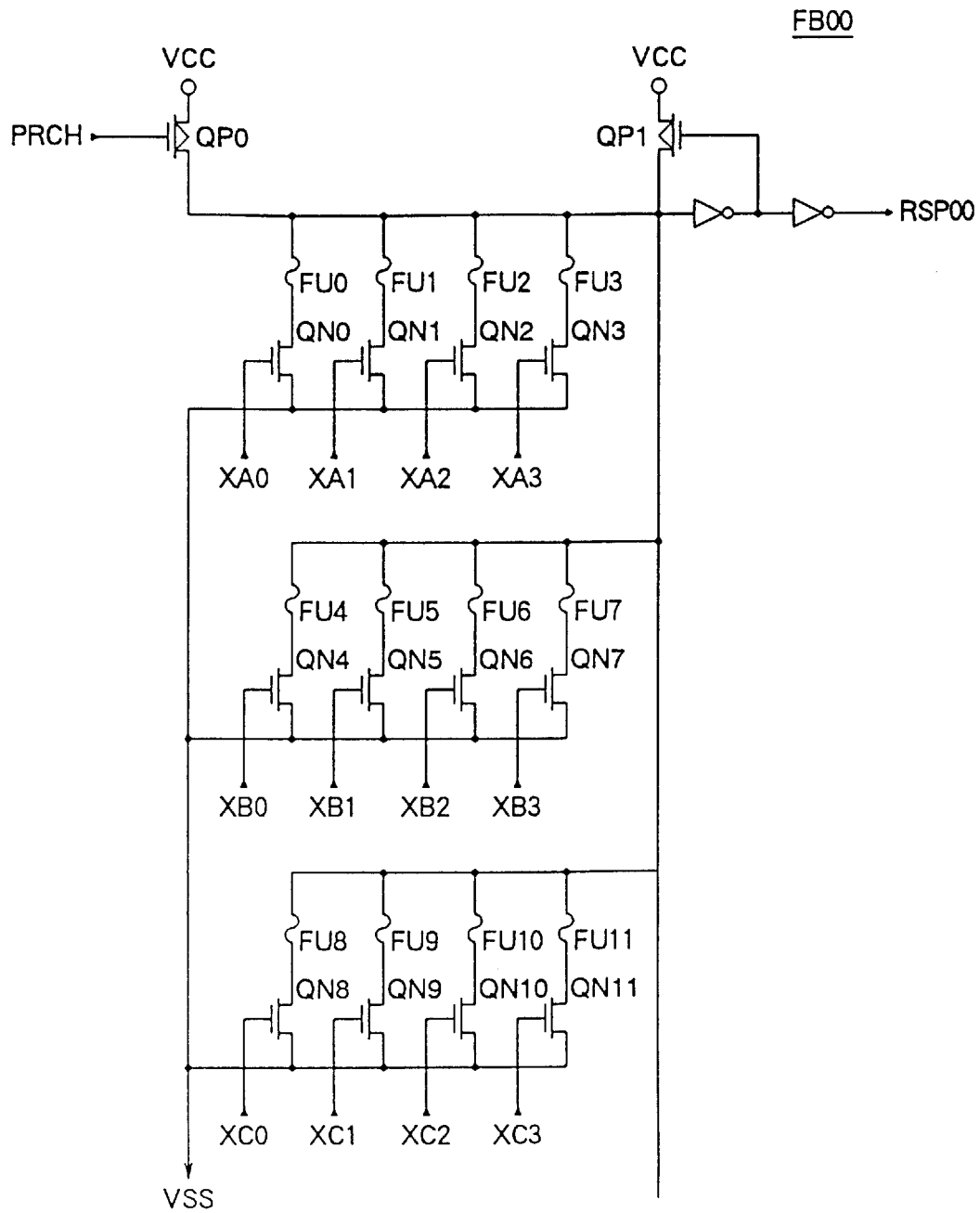
FIG. 13 is a circuit diagram illustrating a redundant memory cell block selection fuse circuit block in the semiconductor memory device in the prior art as well as in the first and second embodiments.

The redundant memory cell block selection fuse circuit blocks FB00, FB10, FB20, FB30 in FIG. 1 have the same construction as the redundant memory cell block selection fuse circuit block relative to the prior art shown in FIG. 13.

The redundant memory cell block selection fuse circuit block includes a P-type MOS transistor QP0 controlled by a signal PRCH and N-type MOS transistors QN0–QN1 controlled by address signals XA0–XA3, XB0–XB3, XC0–XC3. The redundant memory cell block selection fuse circuit block further includes a P-type MOS transistor QP1 controlled signals from N-type MOS transistors QN0–QN11 through fuses FU0–FU11 and inverters as well as by a signal from the P-type MOS transistor QP0. Accordingly, the redundancy indicating signal RSP00 conceived as an output signal of the redundant memory cell block selection fuse circuit block is controlled by the signals from the N-type MOS transistors QN0–QN11 as well as from the P-type MOS transistors QP0, QP1.

Figure 2:
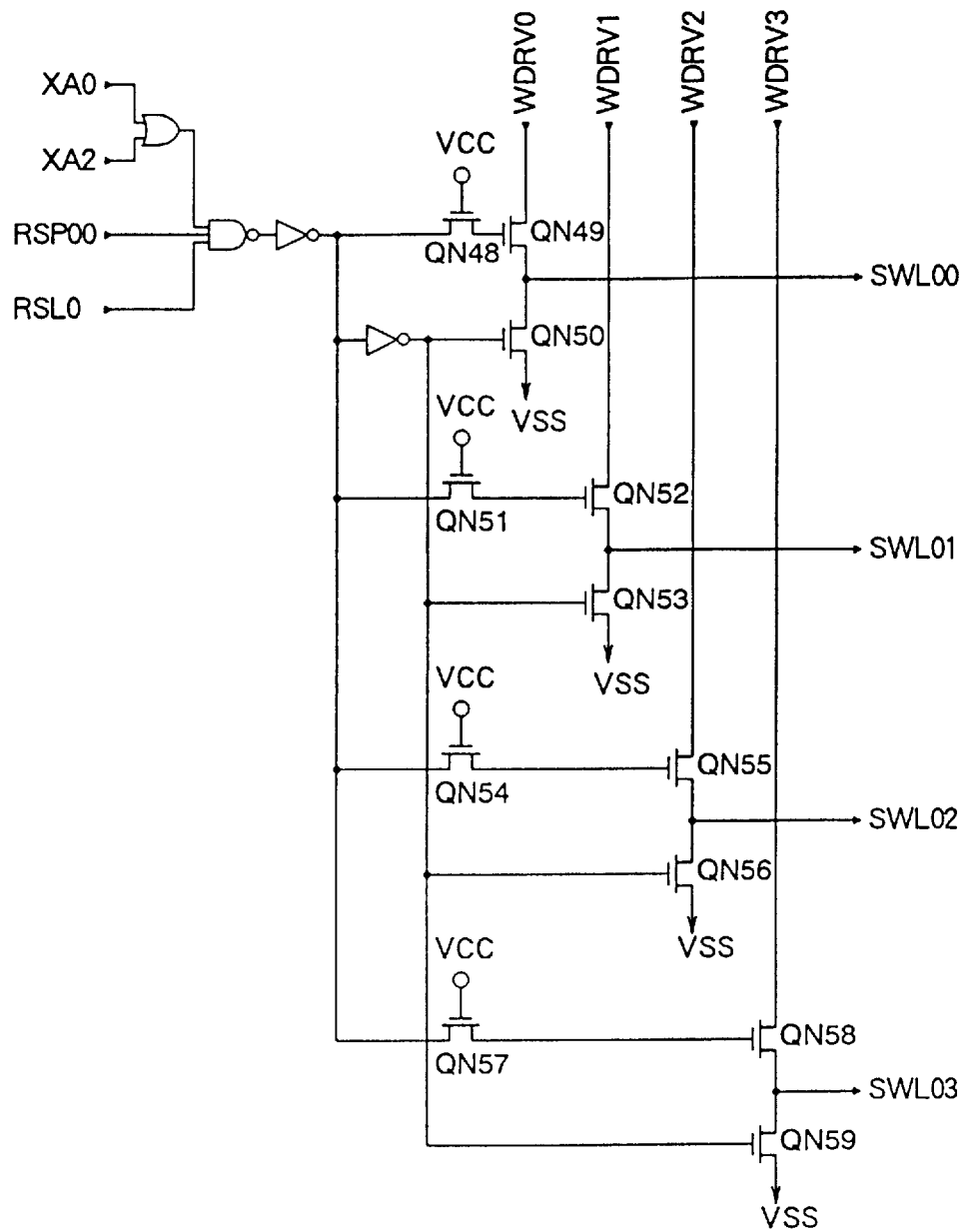
FIG. 2 is a circuit diagram showing a first redundant decoder in the semiconductor memory device in the first embodiment.

FIG. 2 is a circuit diagram illustrating a construction of the first redundant decoder SDEC100 in FIG. 1. Redundant decoders SDEC110, SDEC120, SDEC130 have the same construction as the redundant decoder SDEC100.

Inputted to the first redundant decoder SDEC100 are signals, i.e., the redundancy indicating signal RSP00 and the memory cell array selecting signal RSL0 through an inverter and a NAND gate as well, and the address signals XA0, XA2 through the above-mentioned and an OR gate. The input signals respectively control N-type MOS transistors QN49, QN52, QN55, QN58 through N-type MOS transistors QN48, QN51, QN54, QN57 and also control N-type MOS transistors QN50, QN53, QN56, QN59 through the inverter. The word line drive signals WDRV0, WDRV1, WDRV2, WDRV3 control the redundant word lines SWL00, SWL01, SWL02, SWL03 respectively through the control of the N-type MOS transistors QN49 and QN50, QN52 and QN53, QN55 and QN56, QN58 and QN59.

Figure 3:
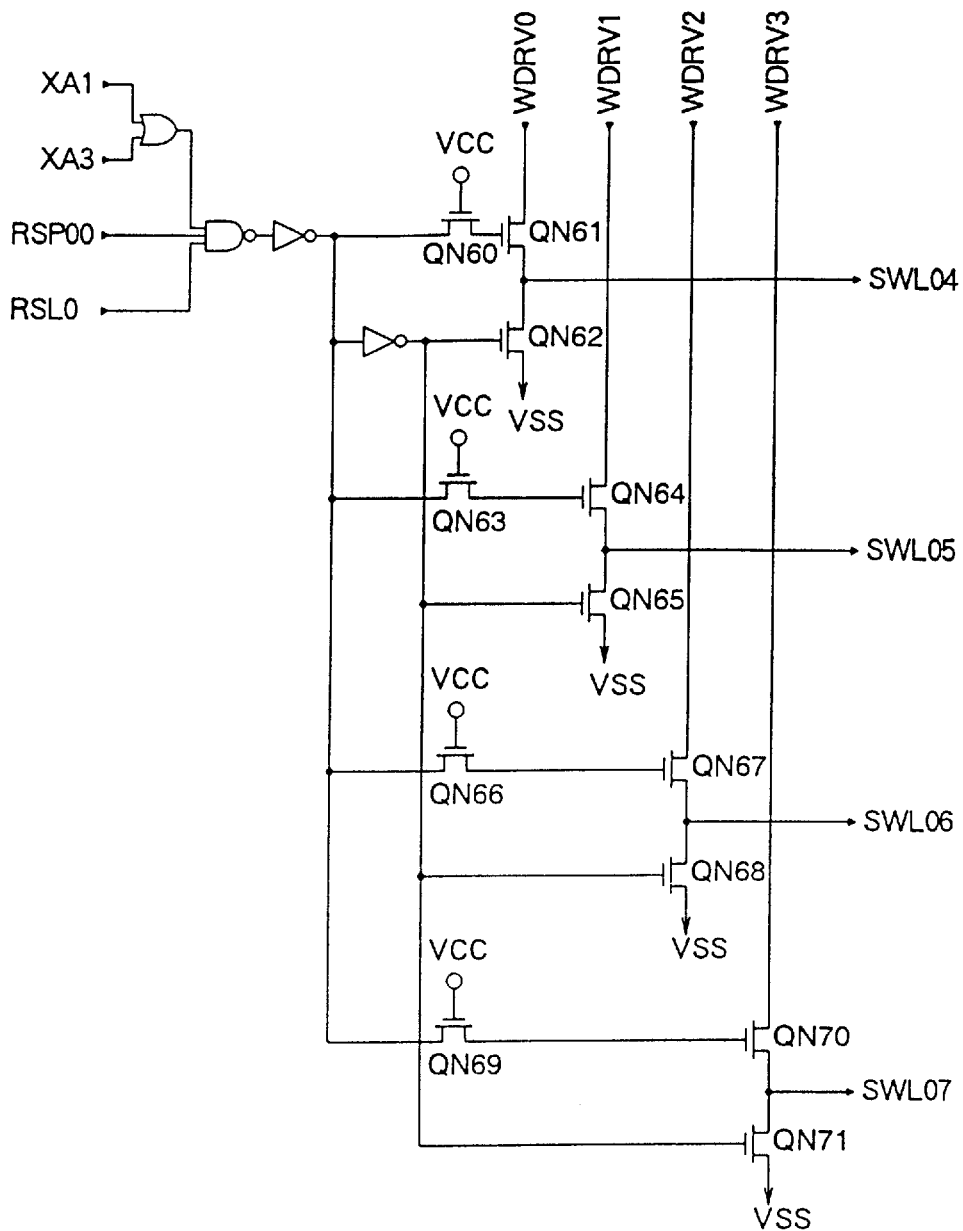
FIG. 3 is a circuit diagram showing a second redundant decoder in the semiconductor memory device in the first embodiment.

FIG. 3 is a circuit diagram illustrating a construction of the second redundant decoder SDEC101 in FIG. 1. Redundant decoders SDEC111, SDEC121, SDEC131 have the same construction as the redundant decoder SDEC101.

Inputted to the second redundant decoder SDEC101 are signals, i.e., the redundancy indicating signal RSP00 and the memory cell array selecting signal RSL0 through the inverter and the NAND gate as well, and the address signals XA1, XA3 through the above-mentioned and the OR gate. The input signals respectively control N-type MOS transistors QN61, QN64, QN67, QN70 through N-type MOS transistors QN60, QN63, QN66, QN69 and also control N-type MOS transistors QN62, QN65, QN68, QN71 through the inverter. The word line drive signals WDRV0, WDRV1, WDRV2, WDRV3 control the redundant word lines SWL04, SWL05, SWL06, SWL07 respectively through the control of the N-type MOS transistors QN61 and QN62, QN64 and QN65, QN67 and QN68, QN70 and QN71.

Figure 4:
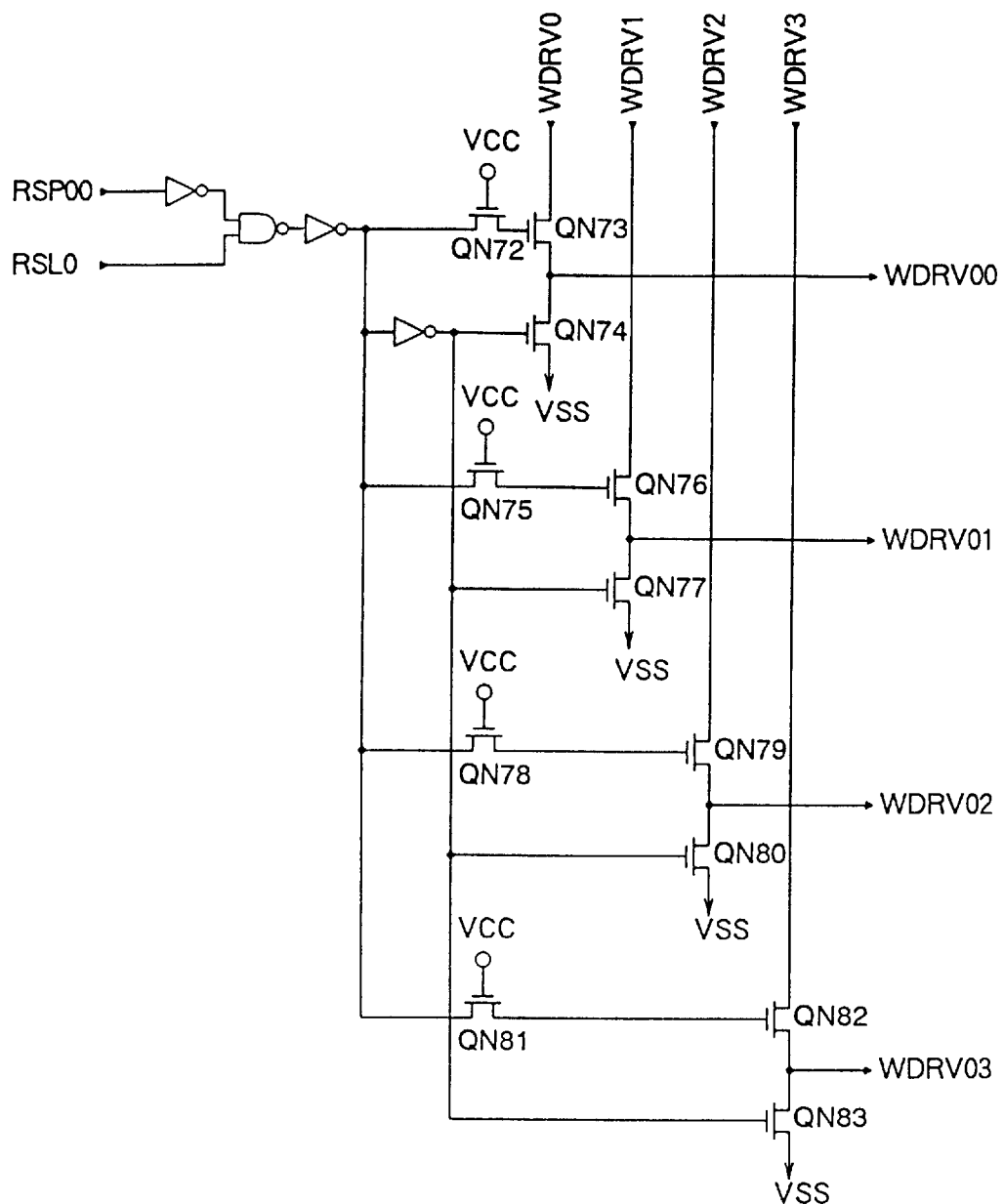
FIG. 4 is a circuit diagram illustrating a normal decoder control circuit in the semiconductor memory device in a third embodiment as well as in the first and second embodiments.

FIG. 4 is a circuit diagram illustrating a construction of the normal decoder control circuit NDC10 in FIG. 1. Normal decoder control circuits NDC11–NDC13 have the same construction as the normal decoder control circuit NDC10.

Inputted to the normal decoder control circuit are a signal, i.e., the memory cell array selecting signal RSL0 through the inverter and the NAND gate and the redundancy indicating signal RSP00 through the above-mentioned and the inverter as well. The input signals respectively control N-type MOS transistors QN73, QN76, QN79, QN82 through N-type MOS transistors QN72, QN75, QN78, QN81 and also control N-type MOS transistors QN74, QN77, QN80, QN83 through the inverter. The word line drive signals WDRV0, WDRV1, WDRV2, WDRV3 control the normal word line drive signals WDRV00, WDRV01, WDRV02, WDRV03 through the control of the N-type MOS transistors QN73 and QN74, QN76 and QN77, QN79 and QN80, QN82 and QN83.

Figure 16:
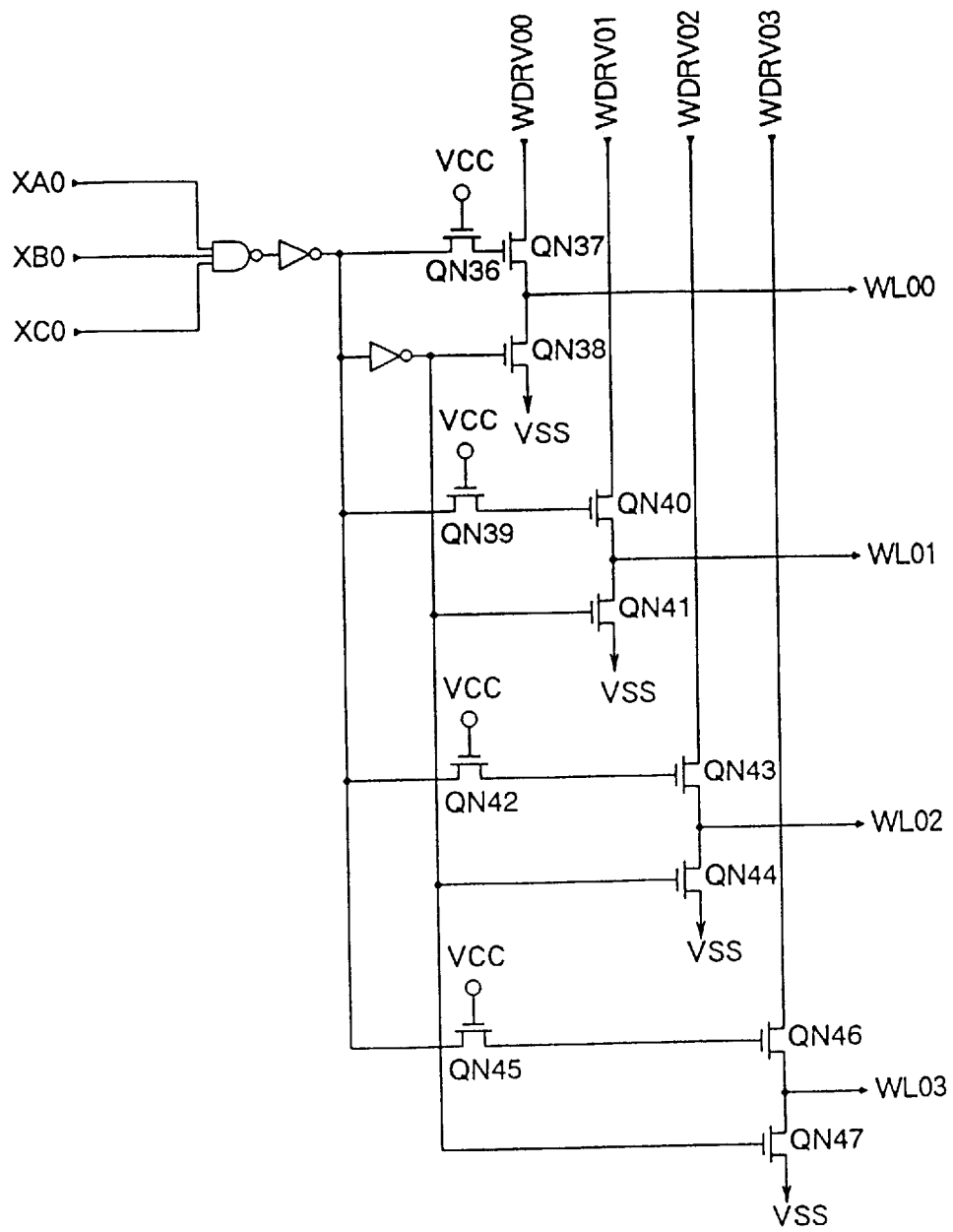
FIG. 16 is a circuit diagram of the normal decoder in the semiconductor memory device in the prior art as well as in the first through third embodiments.

The normal decoders NDEC00–NDEC0n, NDEC10–NDEC1n, NDEC20–NDEC2n, NDEC30–NDEC3n have the same construction as the normal decoder according to the prior art illustrated in FIG. 16.

Inputted to the normal decoder are the address signals XA0, XB0, XC0 through the inverter and the NAND gate as well. The input signals respectively control the N-type MOS transistors QN37, QN40, QN43, QN46 through N-type MOS transistors QN36, QN39, QN42, QN45 and also control N-type MOS transistors QN38, QN41, QN44, QN47 through the inverter. The normal word line drive signals WDRV00, WDRV01, WDRV02, WDRV03 control normal word lines WL00, WL01, WL02, WL03 through the control of the N-type MOS transistors QN37 and QN38, QN40 and QN41, QN43 and QN44, QN46 and QN47.

Referring to FIGS. 1 to 4, a memory cell array MCA0 includes normal memory cell blocks NCB00–NCB0n and redundant memory cell blocks SCB00, SCB01. Memory cell arrays MCA1–MCA3 are other memory cell arrays having the same structure as the memory cell array MCA0. Shown therein are redundant memory cell block selection fuse circuit blocks FB00, FB10, FB20, FB30, redundant decoders SDEC100, SDEC101, SDEC110, SDEC111, . . . , SDEC131, normal decoders NDEC00–NDEC0n, NDEC10–NDEC1n, NDEC20–NDEC2n, NDEC30–NDEC3n, normal decoder control circuits NDC10, NDC11, NDC12, NDC13, address signals XA0–XA3, XB0–XB3, XC0–XC3, memory cell array selecting signals RSL0–RSL3, word line drive signals WDRV0–WDRV3, normal word line drive signals WDRV00–WDRV03, WDRV10–WDRV13, WDRV20–WDRV23, WDRV30–WDRV33, normal word lines WL00, WL01, WL02, WL03, . . . , redundant word lines SWL00, SWL01, SWL02, SWL03, SWL04, SWL05, SWL06, SWL07, redundancy indicating signals RSP00, RSP10, RSP20, RSP30, a signal PRCH, a power supply voltage VCC, a ground voltage VSS and N-type MOS transistors QN48–QN83.

Normally, if an area of flaws causing defects does not extend over one normal memory cell block, it follows that the defects extend to two pieces of normal memory cell blocks adjacent to each other. Therefore, if there is a necessity for replacing the two normal memory cell blocks with two redundant memory cell blocks, those two normal memory cell blocks are adjacent to each other in the great majority of cases.

Under such circumstances, in the first embodiment, if the defective memory cell blocks are contained in the two adjacent normal memory cell blocks selected by the addresses with XC, XB being the same but only XA being different in the combinations of the addresses, those two normal memory cell blocks are replaced with the two redundant memory cell blocks. If there is one normal memory cell block including the defective memory cell, this single normal memory cell block is replaced with one of the two redundant memory cell blocks.

Figure 12:
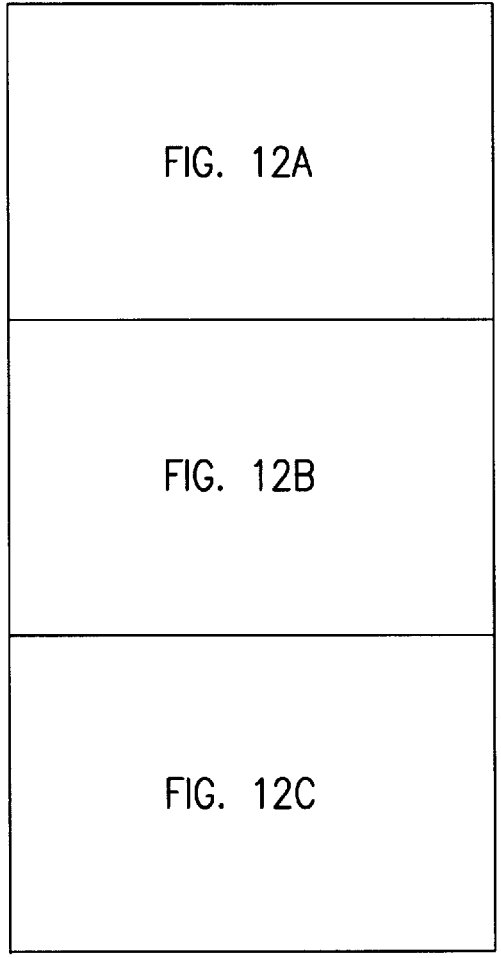
FIG. 12 is a block diagram of the semiconductor memory device in the prior art.
Figure 12A:
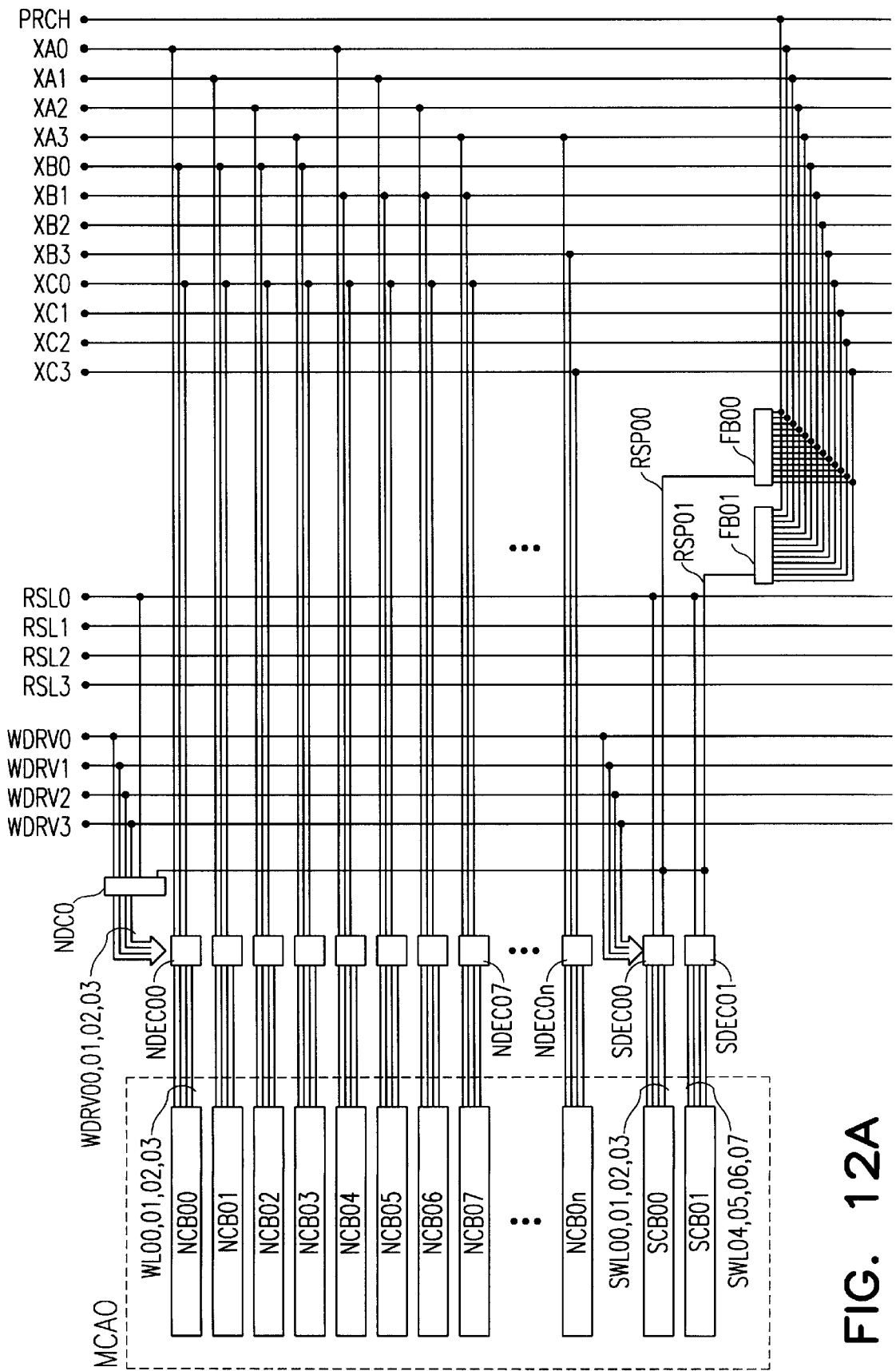
Figure 12B:
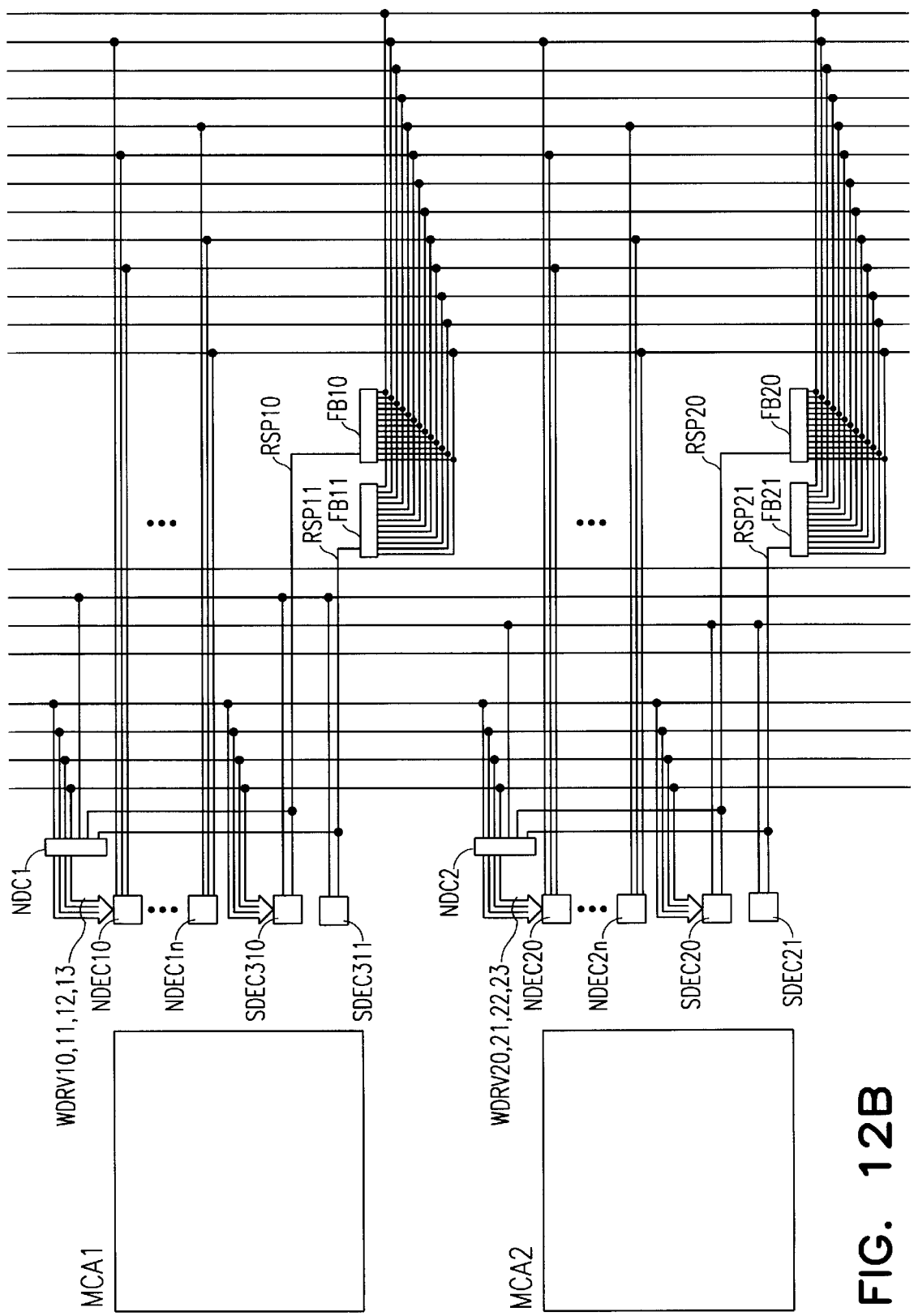
Figure 12C:
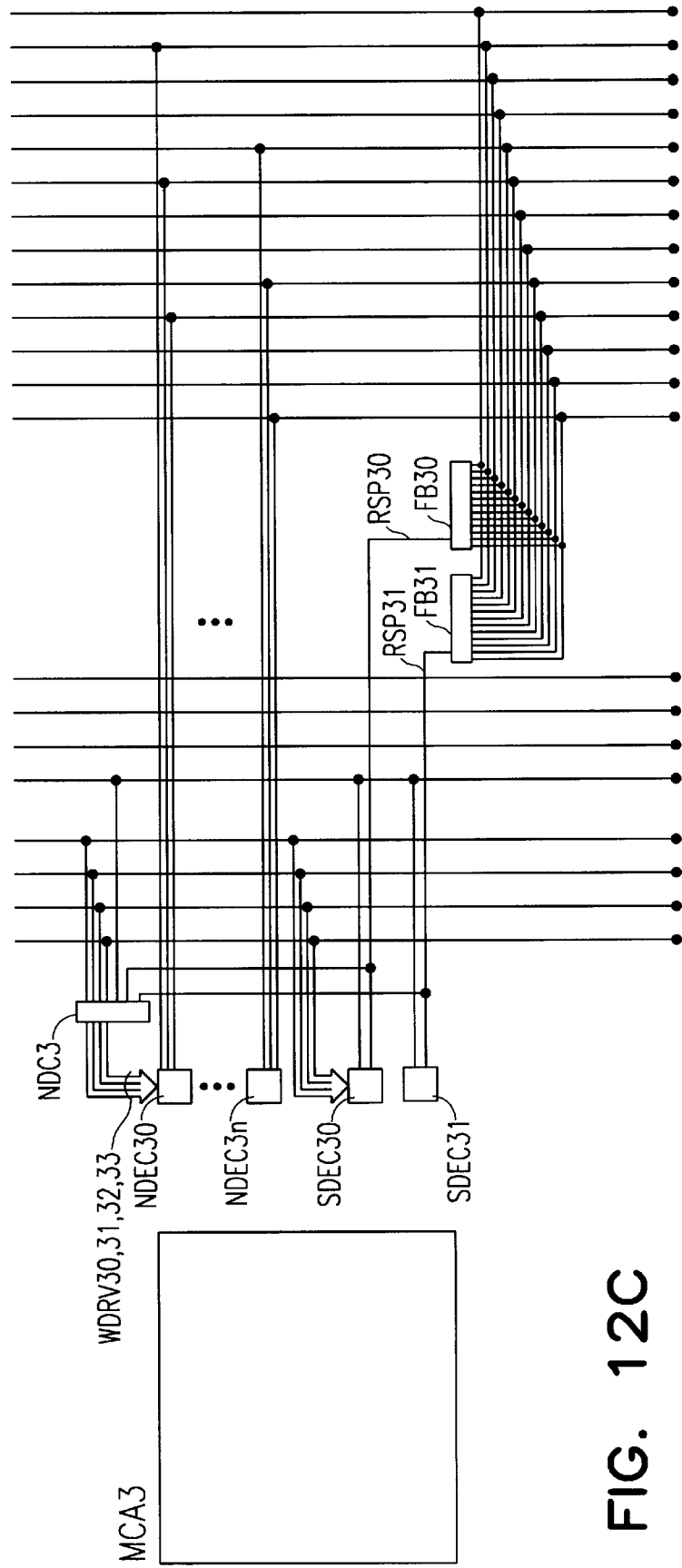

In accordance with the first embodiment, the structure of the memory cell array is the same as the memory cell array shown in FIG. 12. Each memory cell array is provided with a plurality of normal memory cell blocks each having four normal word lines and with two redundant memory cell blocks each having four redundant word lines. However, a difference from the conventional structure shown in FIG. 12 is that there is prepared the single redundant memory cell block selection fuse circuit for selecting those redundant memory cell blocks, and the address signals are inputted to the redundant decoders.

For example, it is the same practice as the prior art that the memory cell array MCA0 is provided with the normal memory cell blocks NCB00–NCB0n and the two redundant memory cell blocks SCB00, SCB01. However, there is prepared only one redundant memory cell block selection fuse circuit block FB00. Then, the address signals XA0, XA2 are inputted to the redundant decoders SDEC100, while the address signals XA1, XA3 are inputted to the redundant decoder SDEC101.

Further, as in the prior art, each normal decoder provided for each normal memory cell block controls the four normal word lines connected to each normal memory cell block. Each redundant decoder provided for each redundant memory cell block controls the four redundant word lines connected to each redundant memory cell block. The word line drive signals WDRV0–WDRV3 are partially decoded by a least significant bit A0R in a row address and a bit A1R that is just higher-order than A0R, and one of them is selected by a logic voltage of each of A0R, A1R, thus obtaining a predetermined word line potential. The arrangement is such that the address signals XA0–XA3 are partially decoded by high-order bits A2R, A3R; the address signals XB0–XB3 are partially decoded by higher-order bits A4R, A5R; and the address signals XC0–XC3 are partially decoded by much higher-order bits A6R, A7R. The memory cell arrays are selected by the memory cell array selecting signals RSL0–RSL3. The normal memory cell blocks in the single memory cell array are selected by selecting the normal decoders with the address signals XA0–XA3, XB0–XB3, XC0–XC3. The normal word lines in the selected memory cell blocks are selected by the normal word line drive signals WDRV00–WDRV03, WDRV10–WDRV13, WDRV20–WDRV23, WDRV30–WDRV33 that are obtained when the word line drive signals WDRV0–WDRV3 are connected via the normal decoder control circuits to the respective normal decoders.

Based on the construction of the first embodiment of the present invention, for example, if one normal memory cell block including the defective memory cell exists in the normal memory cell block provided in, e.g., the memory cell array MCA0, and when making an attempt to replace it with one of the redundant memory cell blocks SCB00, SCB01, the block containing the defective memory cell is to be replaced with the redundant memory cell block by disconnecting the fuse corresponding to the address of the block containing the defective memory cell in the redundant memory cell block selection fuse circuit block FB00, and then the redundant memory cell block is used. As a replacing block, there are used the redundant memory cell block SCB00 if an address XA in the combinations of addresses of the blocks containing the defective memory cells corresponds to XA0 or XA2 but the redundant memory cell block SCB01 if the address XA corresponds to XA1 or XA3. At this time, the fuses disconnected in the redundant memory cell block selection fuse circuit block FB00 are totally three, i.e., one of the four fuses corresponding to the address signals XA0–XA3, one of the four fuses corresponding to XB0–XB3 and the last one among the four fuses corresponding to XC0–XC3.

Further, if the defective memory cell blocks are contained respectively in the two adjacent normal memory cell blocks selected by the addresses with XC, XB being the same but only XA being different in the combinations of the addresses, and when using the two redundant memory cell blocks SCB00, SCB01, those two blocks containing the defective memory cells are replaced respectively with the redundant memory cell blocks SCB00, SCB01 by disconnecting the fuses corresponding to the individual addresses of the two blocks containing the defective memory cells in the redundant memory cell blocks selection fuse circuit block FB00. At this time, the fuses disconnected in the redundant memory cell block selection fuse circuit block FB00 are, with XC and XB being the same but only XA being different among the two address combinations, totally four fuses, i.e., one of the four fuses corresponding to the address signals XC0–XC3, one of the four fuses corresponding to XB0–XB3 and two of the four fuses corresponding to XA0–XA3.

A circuit operation of the semiconductor memory adopting the method of replacing the defective memory cell in accordance with the first embodiment will hereinafter be described in detail with reference to FIGS. 1 through 4 and 13.

Herein, it is assumed that the memory cell array MCA0 among MCA0–MCA3 is selected. At first, in the redundant memory cell block selection fuse circuit block FB00 illustrated in FIG. 13, the signal PRCH is "L"; the P-type MOS transistor QP0 is ON; all the address signals XA0–XA3, XB0–XB3, XC0–XC3 are "L"; the N-type MOS transistors QN0–QN11 are OFF; and the redundancy indicating signal RSP00 is "H". Further, all the memory cell array selecting signals RSL0–RSL3 are "L", and all the word line drive signals WDRV0–WDRV3 are "L". Accordingly, in the redundant decoders SDEC100, SDEC101 illustrated respectively in FIGS. 2 and 3, the redundant word lines SWL00–SWL03 and the redundant word lines SWL04–SWL07 are "L".

To begin with, the signal PRCH becomes "H", while the P-type MOS transistor QP0 is turned OFF. Subsequently, the memory cell array selecting signal RSL0 among RSL0–RSL3, which have all been initially "L", comes to assume "H". Further, totally three address signals come to assume "H", i.e., one of the address signals XA0–XA3, one of XB0–XB3 and one of XC0–XC3, which have all been initially "L". Then, when those address signals are changed into addresses of the memory cell blocks to be selected, three transistors among twelve N-type MOS transistors QN0–QN11 are turned ON corresponding to variations in the address signals.

At this time, if this address combination with "H" is not the combination of addresses of the blocks containing the defective memory cells in the memory cell array MCA0 and does not coincide with a combination of addresses corresponding to the fuses disconnected in the redundant memory cell block selection fuse circuit FB00 provided corresponding to the memory cell array MCA0, the redundancy indicating signal RSP00 becomes "L". Accordingly, even when the memory cell array selecting signal RSL0 becomes "H" in every one of the redundant decoders SDEC100, SDEC101 illustrated respectively in FIGS. 2 and 3, the N-type MOS transistors QN49, QN52, QN55, QN58, QN61, QN64, QN67, QN70 are OFF, while the N-type MOS transistors QN50, QN53, QN56, QN59, QN62, QN65, QN68, QN71 are ON. Hence, all the redundant word lines SWL00–SWL07 remain to be "L" even when one arbitrary signal selected among the word line drive signals WDRV0–WDRV3 becomes a predetermined word line potential. That is, neither the redundant memory cell block SCB00 nor SCB01 is selected.

However, if the above address combination with "H" is the combination of addresses of the blocks containing the defective memory cells in the memory cell array MCA0, and if there are disconnected all the fuses corresponding the relevant addresses in the redundant memory cell block selection fuse circuit block FB00, the redundancy indicating signal RSP00 remains "H". At this time, if the address XA in the above address combination with "H" is XA0 or XA2, and when the memory cell array selecting signal RSL0 assumes "H" in the redundant decoder SDEC100 shown in FIG. 2, the N-type MOS transistors QN49, QN52, QN55, QN58 are ON, while the N-type MOS transistors QN50, QN53, QN56, QN59 are OFF. Further, when one arbitrary signal selected among the word line drive signals WDRV0–WDRV3 becomes a predetermined word line potential, this electric potential is transferred to the corresponding redundant word line. That is, the redundant memory cell block SCB00 is to be selected.

Further, if the address XA in the above address combination with "H" is XA1 or XA3, and when the memory cell array selecting signal RSL0 assumes "H" in the redundant decoder SDEC101 shown in FIG. 3, the N-type MOS transistors QN61, QN64, QN67, QN70 are ON, while the N-type MOS transistors QN62, QN65, QN68, QN71 are OFF. Hence, when one arbitrary signal selected among the word line drive signals WDRV0–WDRV3 becomes a predetermined word line potential, this electric potential is transferred to the corresponding redundant word line. That is, the redundant memory cell block SCB01 is to be selected.

Thus, if there are disconnected all the fuses corresponding the addresses with "H" in the redundant memory cell block selection fuse circuit block FB00, the redundancy indicating signal RSP00 is "H". Therefore, even when the memory cell array selecting signal RSL0 assumes "H" also in the normal decoder control circuit NDC10, the N-type MOS transistors QN73, QN76, QN79, QN82 are OFF, while the N-type MOS transistors QN74, QN77, QN80, QN83 are ON. Accordingly, even when one arbitrary signal selected among the word line drive signals WDRV0–WDRV3 becomes a predetermined word line potential, all the normal word line drive signals WDRV00–WDRV03 remain "L", and all the normal cell blocks NCB00–NCB0n of the relevant memory cell array MCA0 are not selected. As a result, the normal memory cell block selected by the above address combination with "H" is to be replaced with the redundant memory cell block selected by the address XA in that address combination.

The semiconductor memory adopting the method of replacing the defective memory cell in accordance with a second embodiment of the present invention will hereinafter be described with reference to FIGS. 5 through 9.

Figures 5, 5A, 5B, 5C:
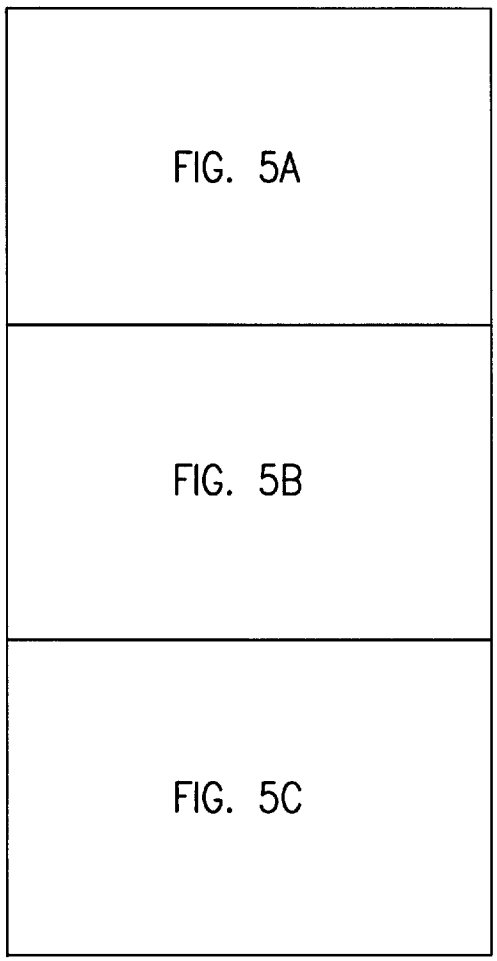
FIG. 5 is a block diagram of the semiconductor memory device in the second embodiment of the present invention.
Figure 5A:
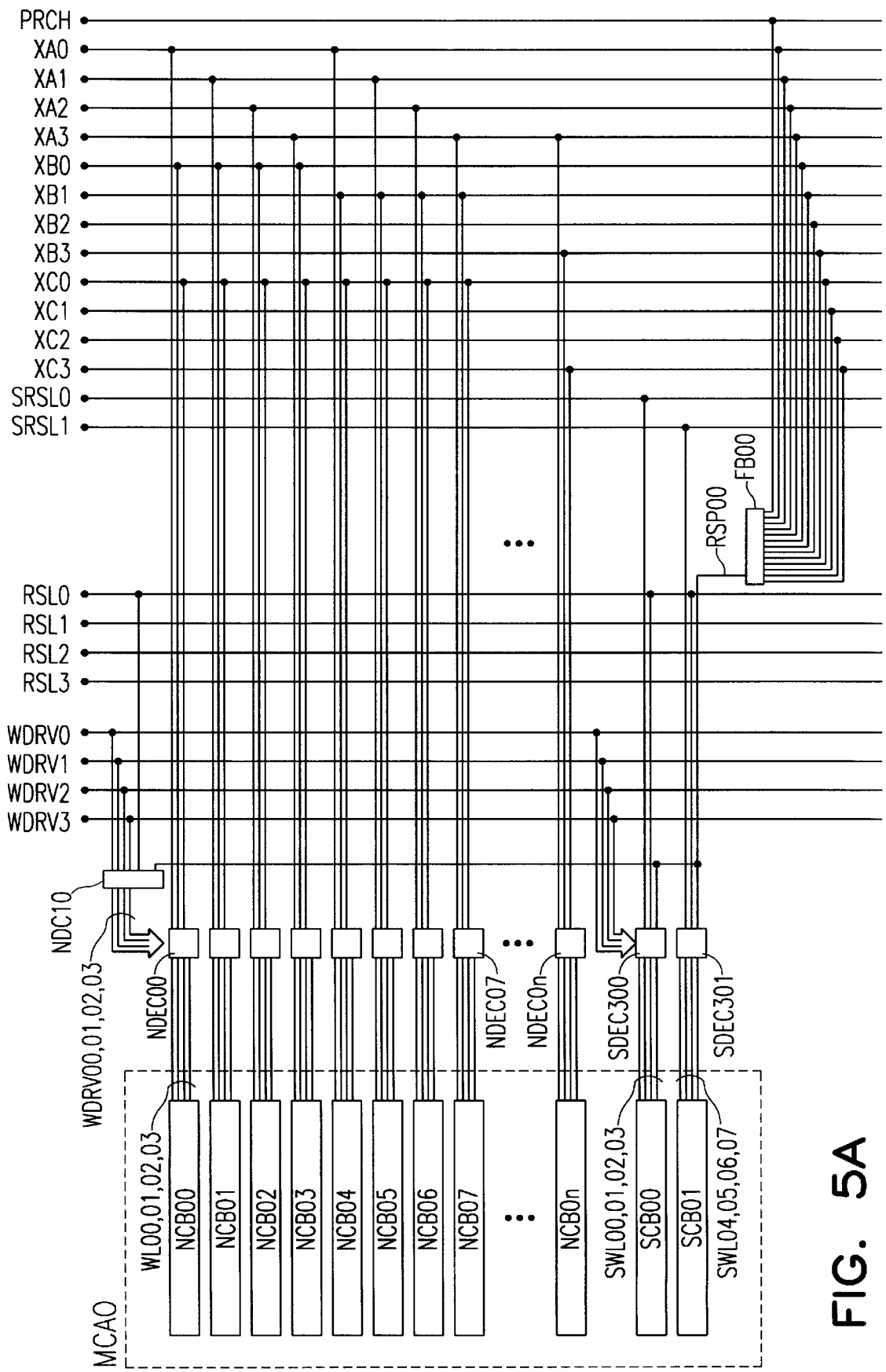
Figure 5B:
Figure 5C:
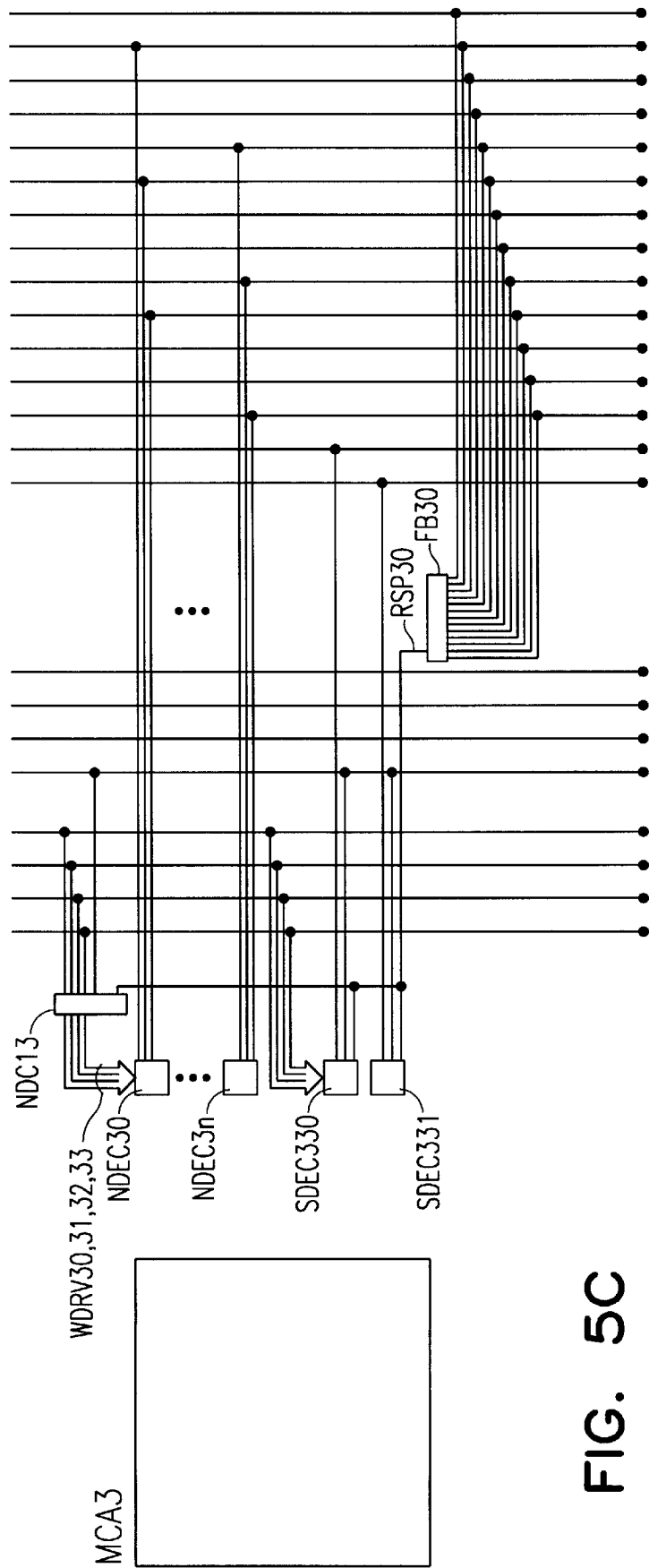

FIG. 5 is a block diagram illustrating a construction of the semiconductor memory device in the second embodiment.

Shown in the uppermost part of the block diagram of FIG. 5 is a memory cell array MCA0 including a plurality of normal memory cell blocks NCB00–NCB0n and two redundant memory cell blocks SCB00, SCB01.

One end of the normal word lines WL00–WL03 is individually connected to the normal memory cell block NCB00, while the other end of the normal word lines WL00–03 connected to the normal decoder NDEC00. Other normal memory cell blocks NCB01–NCB0n are connected via the normal word lines (marked with no symbol in the Figure) to other normal decoders NDEC01–NDEC0n.

Inputted to each of the normal decoders NDEC00–NDEC0n are one of the address signals XA0–XA3, one of XB0–XB3 and one of XC0–XC3 corresponding to addresses of the normal memory cell blocks connected via the normal word lines WL00–WL03, ... to the respective normal decoders NDEC00–NDEC0n. Inputted further thereto are word line drive signals WDRV00–WDRV03 transmitted from the normal decoder control circuit NDE10.

Inputted to the normal decoder control circuit NDC10 are the memory cell array selecting signal RSL0 and the redundancy indicating signal RSP00 from the redundant memory cell block selection fuse circuit block FB00.

One end of the redundant word lines SWL00–SWL03, SWL04–SWL07 is individually connected to two pieces of redundant memory cell blocks SCB00, SCB01, while the other end of the redundant word lines SWL00–SWL03, SWL04–SWL07 is connected to redundant decoders SDEC300, SDEC301.

Inputted to the redundant decoder SDEC300 are the word line drive signals WDRV0–WDRV3, the redundant decoder selecting signal SRSL0, the redundancy indicating signal RSP00 from the redundant memory cell block selection fuse circuit block FB00 and the memory cell array selecting signals RSL0.

Inputted to the redundant decoder SDEC301 are the word line drive signals WDRV0–WDRV3, the redundant decoder selecting signal SRSL1, the redundancy indicating signal RSP00 from the redundant memory cell block selection fuse circuit block FB00 and the memory cell array selecting signals RSL0.

A connecting relationship at the uppermost part of the block diagram has been explained so far, and every stage has a construction based on the same connecting relationship.

The redundant memory cell block selection fuse circuit blocks FB00, FB10, FB20, FB30 in FIG. 5 have the same construction as the redundant memory cell block selection fuse circuit block relative to the prior art shown in FIG. 13.

Figure 6:
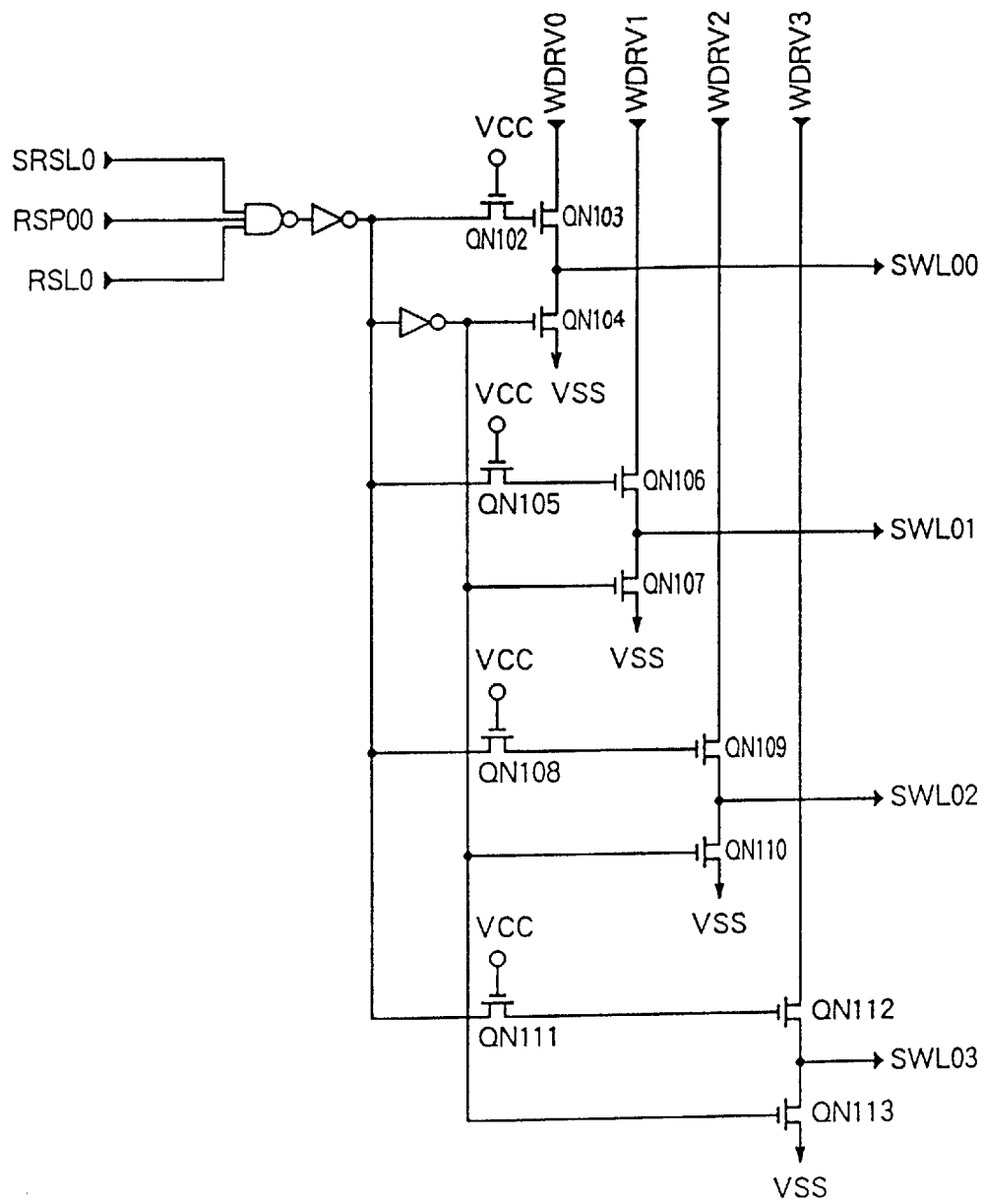
FIG. 6 is a circuit diagram of a first redundant decoder in the semiconductor memory device in the second embodiment.

FIG. 6 is a circuit diagram illustrating a construction of a first redundant decoder SDEC300 in FIG. 5, and redundant decoders SDEC310, SDEC320, SDEC330 have the same construction as the redundant decoder SDEC300.

Inputted to the first redundant decoder SDEC300 are signals, i.e., a redundant decoder selecting signal SRSL0, a redundance indicating signal RSP00 and a memory cell array selecting signal RSL0 through the inverter and the NAND gate as well. The input signals respectively control N-type MOS transistors QN103, QN106, QN109, QN112 through N-type MOS transistors QN102, QN105, QN108, QN111 and also control N-type MOS transistors QN104, QN107, QN110, QN113 through the inverter. The word line drive signals WDRV0, WDRV1, WDRV2, WDRV3 control the redundant word lines SWL00, SWL01, SWL02, SWL03 respectively through the control of the N-type MOS transistors QN103 and QN104, QN106 and QN107, QN109 and QN110, QN112 and QN113.

Figure 7:
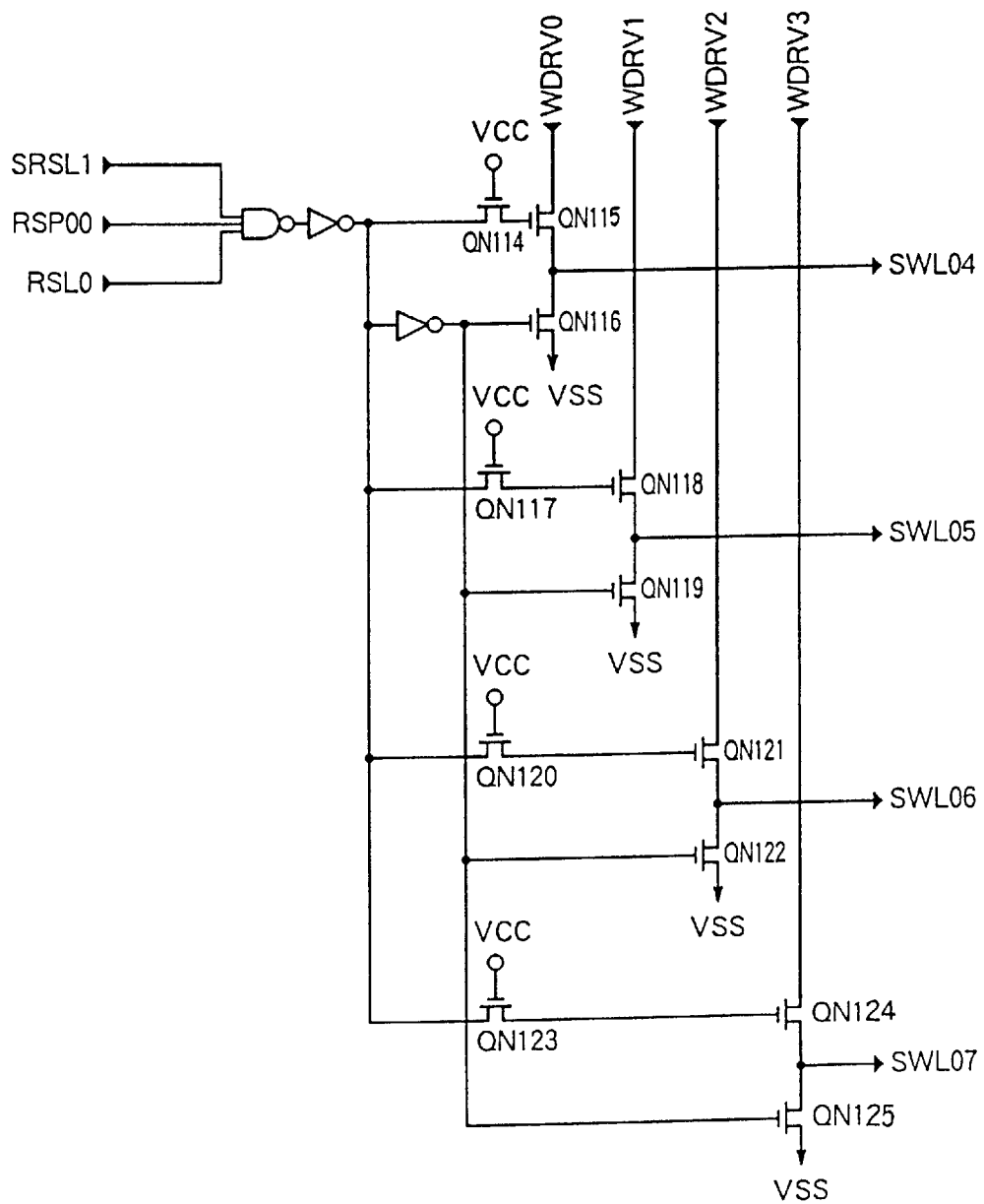
FIG. 7 is a circuit diagram of a second redundant decoder in the semiconductor memory device in the second embodiment.

FIG. 7 is a circuit diagram illustrating a construction of a second redundant decoder SDEC301 in FIG. 5. Redundant decoders SDEC311, SDEC321, SDEC331 have the same construction as the redundant decoder SDEC301.

Inputted to the second redundant decoder SDEC301 are signals, i.e., a redundant decoder selecting signal SRSL1, the redundance indicating signal RSP00 and the memory cell array selecting signal RSL0 through the inverter and the NAND gate as well. The input signals respectively control N-type MOS transistors QN115, QN118, QN121, QN124 through N-type MOS transistors QN114, QN117, QN120, QN123 and also control N-type MOS transistors QN116, QN119, QN122, QN125 through the inverter. The word line drive signals WDRV0, WDRV1, WDRV2, WDRV3 control the redundant word lines SWL04, SWL05, SWL06, SWL07 respectively through the control of the N-type MOS transistors QN115 and QN116, QN118 and QN119, QN121 and QN122, QN124 and QN125.

The normal decoder control circuits NDC10–NDC13 in FIG. 5 have the same construction as the normal decoder control circuit in the first embodiment illustrated in FIG. 4.

Normal decoders NDEC00–NDEC0n, NDEC10–NDEC1n, NDEC20–NDEC2n, NDEC30–NDEC3n in FIG. 5 have the same construction as the normal decoder in the prior art shown in FIG. 16.

Shown in FIGS. 5, 6 and 7 are the memory cell array MCA0 including the normal memory cell blocks NCB00–NCB0n and the redundant memory cell blocks SCB00, SCB01 and other memory cell arrays MCA1–MCA3 having the same construction as the memory cell array MCA0. Shown also there are the redundant memory cell block selection fuse circuit blocks FB00, FB10, FB20, FB30, the redundant decoders SDEC300, SDEC301, SDEC310, SDEC311, . . . , SDEC331, the normal decoders NDEC00–NDEC0n, NDEC10–NDEC1n, NDEC20–NDEC2n, NDEC30–NDEC3n, the normal decoder control circuits NDC10, NDC11, NDC12, NDC13, the address signals XA0–XA3, XB0–XB3, XC0–XC3, the memory cell array selecting signals RSL0–RSL3, the redundant decoder selecting signals SRSL0, SRSL1, the word line drive signals WDRV0–WDRV3, the normal word line drive signals WDRV00–WDRV03, WDRV10–WDRV13, WDRV20–WDRV23, WDRV30–WDRV33, the normal word lines WL00, WL01, WL02, WL03, . . . , the redundant word lines SWL00, SWL01, SWL02, SWL03, SWL04, SWL05, SWL06, SWL07, the redundancy indicating signals RSP00, RSP10, RSP20, RSP30, the signal PRCH, the power supply voltage VCC, the ground voltage VSS and N-type MOS transistors QN102–QN125.

As discussed above, according to the first embodiment, it is possible to replace the two normal memory cell blocks adjacent to each other and selected by the address combination with one and the other addresses XC, XB being the same but only the least-significant address XA being different in the two normal memory cell blocks adjacent to each other with the two redundant memory cell blocks by disconnecting totally four fuses, i.e., the two fuses corresponding in common to the same addresses XC, XB and the two fuses corresponding to the different address XA in the single redundant memory cell block selection fuse circuit block.

In contrast with this, according to the construction of the second embodiment, it is feasible to replace not only the two adjacent normal memory cell blocks selected by the address combination with one and the other addresses XC, XB being the same but only the least-significant address XA being different but also the two arbitrary normal memory cell blocks adjacent to each other with the two redundant memory cell blocks.

If there is one normal memory cell block containing the defective memory cell, it is the same as the first embodiment to replace that one normal memory cell block with any one of the two redundant memory cell blocks. Hence, there will hereinafter be explained such a case that arbitrary two normal memory cell blocks adjacent to each other are replaced with two redundant memory cell blocks by the single redundant memory cell block selection fuse circuit block in the construction of the second embodiment.

In accordance with the second embodiment, the memory cell array has the same configuration as that of the memory cell array in accordance with the first embodiment of FIG. 1. Each memory cell array is provided with a plurality of normal memory cell blocks each having four normal word lines and with two redundant memory cell blocks each having four redundant word lines. However, a difference from the structure of the first embodiment shown in FIG. 1 is that the redundant decoder selecting signal is inputted to the redundant decoder and that the addresses allocated to the normal memory cell blocks are arranged so that two of XC, XB, XA are always the same but only one left is different with respect to the combination of one addresses with other addresses of the arbitrary two normal memory cell blocks adjacent to each other.

As in the first embodiment, the memory cell array is structured such that the memory cell array MCA0 is provided with the normal memory cell blocks NCB00–NCB0n and the two redundant memory cell blocks SCB00, SCB01. Further, as in the same way with the first embodiment and the prior art as well, each normal decoder provided for each normal memory cell block controls the four normal word lines connected to each normal memory cell block. Each redundant decoder provided for each redundant memory cell block controls the four redundant word lines connected to each redundant memory cell block. The word line drive signals WDRV0–WDRV3 are partially decoded by the least significant bit A0R in the row address and the bit A1R that is just higher-order than A0R, and one of them is selected by a logic voltage of each of A0R, A1R, thus obtaining a predetermined word line potential. The arrangement is such that the address signals XA0–XA3 are partially decoded by the high-order bits A2R, A3R; the address signals XB0–XB3 are partially decoded by the higher-order bits A4R, A5R; and the address signals XC0–XC3 are partially decoded by the much higher-order bits A6R, A7R. The memory cell arrays are selected by the memory cell array selecting signals RSL0–RSL3. The normal memory cell blocks in the single memory cell array are selected by selecting the normal decoders with the address signals XA0–XA3, XB0–XB3, XC0–XC3. The normal word lines in the selected memory cell blocks are selected by the normal word line drive signals WDRV00–WDRV03, WDRV10–WDRV13, WDRV20–WDRV23, WDRV30–WDRV33 that are obtained when the word line drive signals WDRV0–WDRV3 are connected via the normal decoder control circuits to the respective normal decoders.

The above is the same as the first embodiment. In accordance with the second embodiment, however, the redundant decoder selecting signal SRL0 is inputted to the redundant decoder SDEC300, and the redundant decoder selecting signal SRSL1 is inputted to the redundant decoder SDEC301. The arrangement is such that one of the redundant decoder selecting signals SRSL0, SRSL1 assumes "H" in accordance with the address of the normal memory cell block; when inputting the address signals of the normal memory cell blocks NCB00, NCB02, NCB04, NCB06, . . . arranged in the memory cell array, the signal SRSL0 assumes "H"; and the signal SRSL1 assumes "H" when inputting the address signals of the normal memory cell blocks NCB01, NCB03, NCB05, NCB07, . . . .

Further, the second embodiment is characterized by a mode in which the addresses allocated to the normal memory cell blocks are arranged, and this is a different part from the configuration of the first embodiment.

Figures 8, 9:
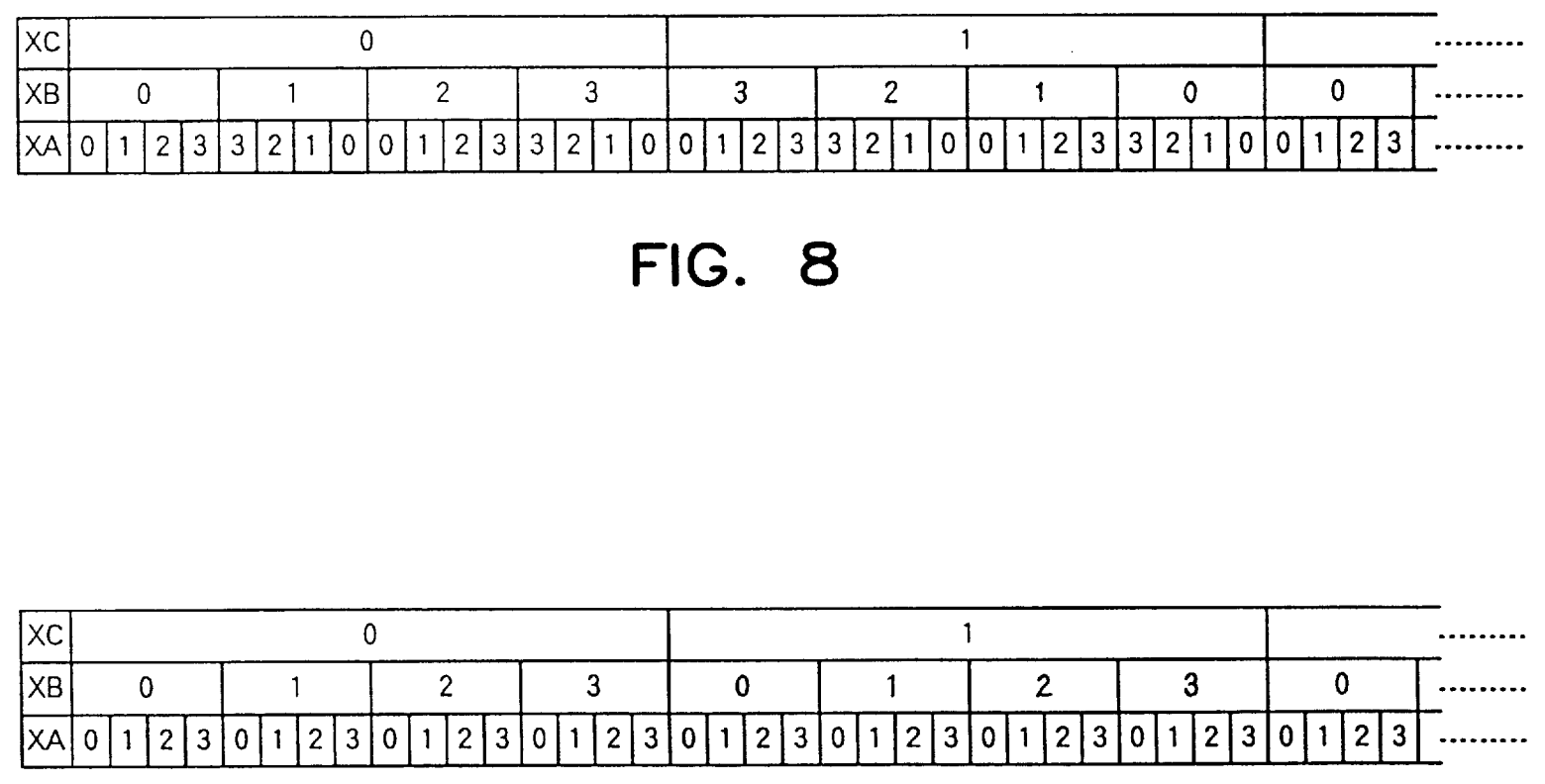

FIG. 8 is an explanatory diagram schematically showing an arrangement of the addresses allocated to the normal memory cell blocks in the semiconductor memory device in the second embodiment. FIG. 9 is, as a comparative contrast with FIG. 8, an explanatory diagram schematically illustrating an arrangement of the addresses allocated to the normal memory cell blocks in the semiconductor memory device in the first embodiment or the prior art.

According to the construction of the second embodiment, there will be described the mode of arranging the addresses allocated to the normal memory cell blocks, wherein arbitrary two normal memory cell blocks adjacent to each other can be replaced with the two redundant memory cell blocks by the single redundant memory cell block selection fuse circuit block.

In the mode of arranging the addresses in the prior art or the first embodiment of FIG. 9, with respect to each of XC, XB, XA, the addresses allocated thereto are arranged sequentially from the left of FIG. 9 repeatedly such as 0, 1, 2, 3, 0, 1, 2, 3, . . . . Accordingly, the respective addresses of the two normal memory cell blocks adjacent to each other are combined in three ways. That is, there are a first case where two addresses XC, XB are the same but only one address XA is different such as, e.g., (XC0, XB0, XA2) and (XC0, XB0, XA3), and, in addition to this, two cases where only the XC is the same but XB and XA are different as seen in a combination such as (XC0, XB0, XA3) and (XC0, XB1, XA0) and where XC, XB, XA are all different as seen in a combination such as (XC0, XB3, XA3 and (XC1, XB0, XA0). Based on the construction of the first embodiment, the two normal memory cell blocks adjacent to each other can be replaced with the two redundant memory cell blocks by the single redundant memory cell block selection fuse circuit block only when the two addresses XC and XB are the same but only XA is different in the respective address combinations of the two normal memory cell blocks among the three ways of combinations. The two normal cell blocks can not be replaced when applied to the other two ways.

While in the mode of arranging the addresses in the second embodiment of FIG. 8, with respect to each of XC, XB, XA, the addresses allocated are arranged sequentially from the left side of FIG. 8 such as 0, 1, 2, 3 and next 3, 2, 1, 0. Further, those addresses are arranged such as 3, 2, 1, 0 and next 0, 1, 2, 3 and thus sequentially arranged according to this rule. Accordingly, in the respective address combinations of the two normal memory cell blocks adjacent to each other, even if any combination is arbitrarily selected, two of XC, XB, XA are necessarily the same, but only one is different.

As a result, according to the construction of the second embodiment, it is always possible to replace the arbitrary two normal memory cell blocks adjacent to each other with the two redundant memory cell blocks by the single redundant memory cell block selection fuse circuit block.

In the construction of the above-discussed second embodiment of the present invention, for instance, if the single piece of normal memory cell block containing the defective memory cell exists in the normal memory cell blocks provided in the memory cell array MCA0, and when making an attempt to replace it with one of the redundant memory cell blocks SCB00, SCB01, the block containing the defective memory cells is replaced with the redundant memory cell block by disconnecting the fuse corresponding to the address of the block containing the defective memory cells in the redundant memory cell block selection fuse circuit block FB00, thus using the redundant memory cell block. On this occasion, the replacing block is selected by the redundant decoder selecting signal determined based on the address combination of the blocks containing the defective memory cell. If SRSL0 is "H", the redundant memory cell block SCB00 is used. If SRSL1 is "H", the redundant memory cell block SCB01 is employed. At this time, the fuses disconnected in the redundant memory cell block selection fuse circuit block FB00 are totally three, i.e., one of the four fuses corresponding to the address signals XA0–XA3, one of the four fuses corresponding to XB0–XB3 and the last one among the four fuses corresponding to XC0–XC3.

Further, if the defective memory cell blocks are contained respectively in the two adjacent normal memory cell blocks, and when replaced with the two redundant memory cell blocks SCB00, SCB01, the two blocks containing the defective memory cells are replaced with the redundant memory cell blocks SCB00, SCB01 by disconnecting the fuse corresponding to the addresses of the two blocks containing the defective memory cells in the redundant memory cell block selection fuse circuit block FB00. At this time, in the couple of address combinations, two of XC, XB, XA are invariably the same, but only one is different, and therefore the fuses disconnected in the redundant memory cell block selection fuse circuit block FB00 are totally four fuses, i.e., two of the four fuses corresponding to the same addresses and two of the four fuses corresponding to the addresses different from each other.

A circuit operation of the semiconductor memory adopting the method of replacing the defective memory cell in accordance with the second embodiment will hereinafter be described in detail with reference to FIGS. 5, 6, 7, 4 and 13.

Herein, it is assumed that the memory cell array MCA0 among MCA0–MCA3 is selected. At first, in the redundant memory cell block selection fuse circuit block FB00 illustrated in FIG. 13, the signal PRCH is "L"; the P-type MOS transistor QP0 is ON; all the address signals XA0–XA3, XB0–XB3, XC0–XC3 are "L"; the N-type MOS transistors QN0–QN11 are OFF; and the redundancy indicating signal RSP00 is "H". Further, all the memory cell array selecting signals RSL0–RSL3 are "L", and all the word line drive signals WDRV0–WDRV3 are "L". Accordingly, in the redundant decoders SDEC300, SDEC301 illustrated respectively in FIGS. 6 and 7, the redundant word lines SWL00–SWL03 and the redundant word lines SWL04–SWL07 are "L".

To begin with, the signal PRCH becomes "H", while the P-type MOS transistor QP0 is turned OFF. Subsequently, the memory cell array selecting signal RSL0 among RSL0–RSL3, which have all been initially "L", comes to assume "H". Further, totally three address signals come to assume "H", i.e., one of the address signals XA0–XA3, one of XB0–XB3 and one of XC0–XC3, which have all been initially "L". Then, when those address signals are changed into addresses of the memory cell blocks to be selected, three transistors among twelve N-type MOS transistors QN0–QN11 are turned ON corresponding to variations in the address signals.

At this time, if this address combination with "H" is not the combination of addresses of the blocks containing the defective memory cells in the memory cell array MCA0 and does not coincide with a combination of addresses corresponding to the fuses disconnected in the redundant memory cell block selection fuse circuit FB00 provided corresponding to the memory cell array MCA0, the redundancy indicating signal RSP00 becomes "L". Accordingly, even when the memory cell array selecting signal RSL0 becomes "H" in every one of the redundant decoders SDEC300, SDEC301 illustrated respectively in FIGS. 6 and 7, the N-type MOS transistors QN103, QN106, QN109, QN112, QN115, QN118, QN121, QN124 are OFF, while the N-type MOS transistors QN104, QN107, QN110, QN113, QN116, QN119, QN122, QN125 are ON. Hence, all the redundant word lines SWL00–SWL07 remain to be "L" even when one arbitrary signal selected among the word line drive signals WDRV0–WDRV3 becomes a predetermined word line potential. That is, neither the redundant memory cell block SCB00 nor SCB01 is selected.

However, if the above address combination with "H" is the combination of addresses of the blocks containing the defective memory cells in the memory cell array MCA0, and if there are disconnected all the fuses corresponding the relevant addresses in the redundant memory cell block selection fuse circuit block FB00, the redundancy indicating signal RSP00 remains "H". At this time, if the redundant decoder selecting signal SRSL0 becomes "H" due to the address combination with "H", and when the memory cell array selecting signal RSL0 assumes "H" in the redundant decoder SDEC300 shown in FIG. 6, the N-type MOS transistors QN103, QN106, QN109, QN112 are ON, while the N-type MOS transistors QN104, QN107, QN110, QN113 are OFF. Further, when one arbitrary signal selected among the word line drive signals WDRV0–WDRV3 becomes a predetermined word line potential, this electric potential is transferred to the corresponding redundant word line. That is, the redundant memory cell block SCB00 is to be selected.

Further, if the redundant decoder selecting signal SRSL1 is "H" due to the address combination with "H", and when the memory cell array selecting signal RSL0 assumes "H" in the redundant decoder SDEC301 shown in FIG. 7, the N-type MOS transistors QN115, QN118, QN121, QN124 are ON, while the N-type MOS transistors QN116, QN119, QN122, QN125 are OFF. Hence, when one arbitrary signal selected among the word line drive signals WDRV0–WDRV3 becomes a predetermined word line potential, this electric potential is transferred to the corresponding redundant word line. That is, the redundant memory cell block SCB01 is to be selected.

Thus, if there are disconnected all the fuses corresponding to addresses with "H" in the redundant memory cell block selection fuse circuit block FB00, the redundancy indicating signal RSP00 is "H". Therefore, even when the memory cell array selecting signal RSL0 assumes "H" also in the normal decoder control circuit NDC10, the N-type MOS transistors QN73, QN76, QN79, QN82 are OFF, while the N-type MOS transistors QN74, QN77, QN80, QN83 are ON. Accordingly, even when one arbitrary signal selected among the word line drive signals WDRV0–WDRV3 becomes a predetermined word line potential, all the normal word line drive signals WDRV00–WDRV03 remain "L", and all the normal cell blocks NCB00–NCB0n of the relevant memory cell array MCA0 are not selected. As a result, the normal memory cell block selected by the above address combination with "H" is to be replaced with the redundant memory cell block selected by the redundant decode selecting signal determined corresponding to the address combination thereof.

The semiconductor memory adopting the method of replacing the defective memory cell in accordance with a third embodiment of the present invention will hereinafter be described with reference to FIGS. 10 and 11.

Figure 10:
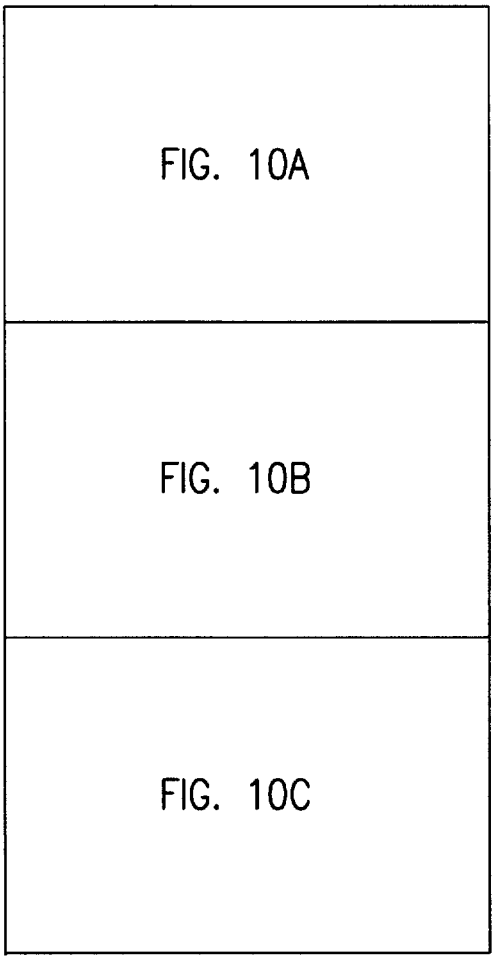
FIG. 10 is a block diagram of the semiconductor memory device in a third embodiment of the present invention.
Figure 10A:
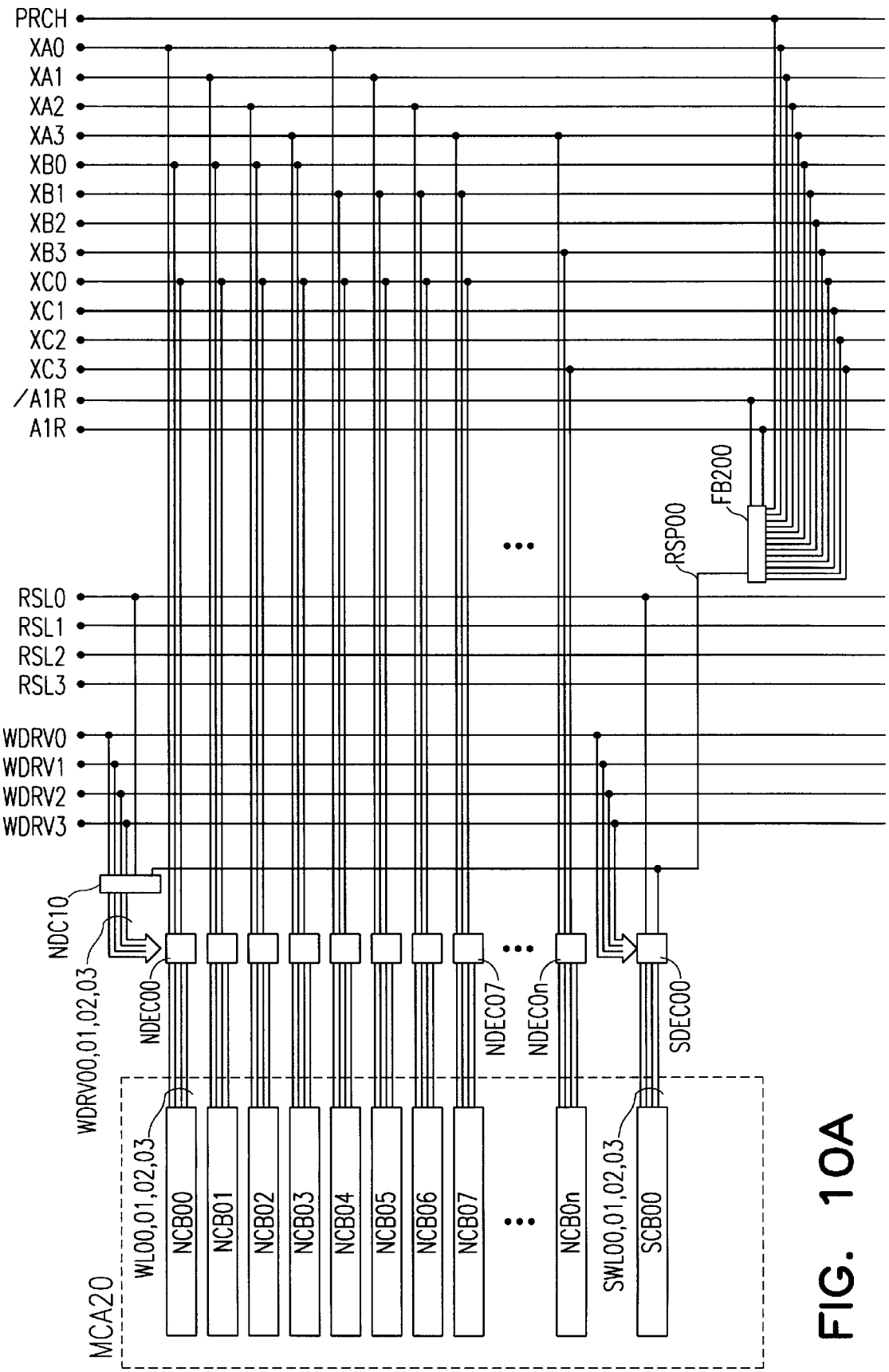
Figure 10B:
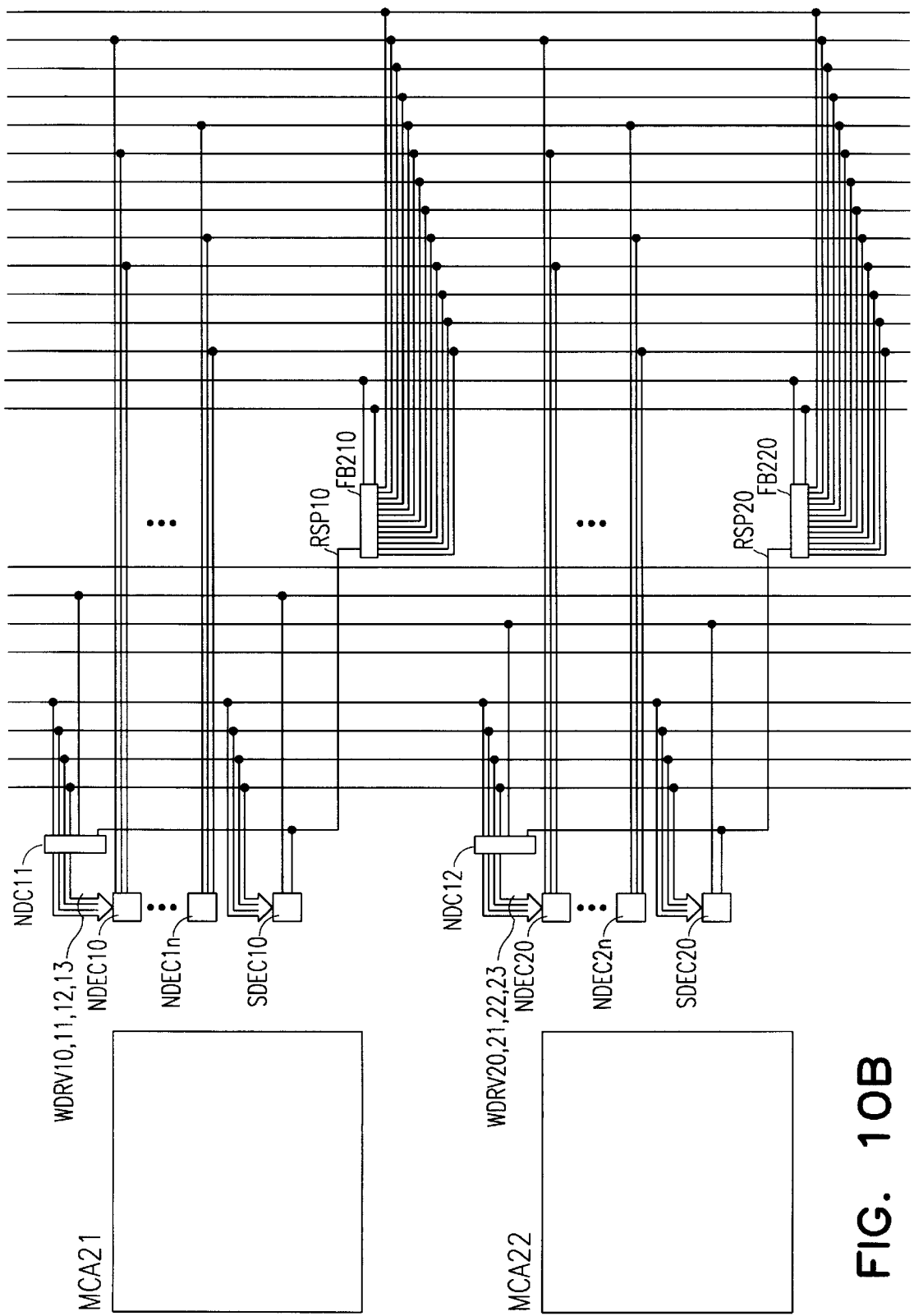
Figure 10C:
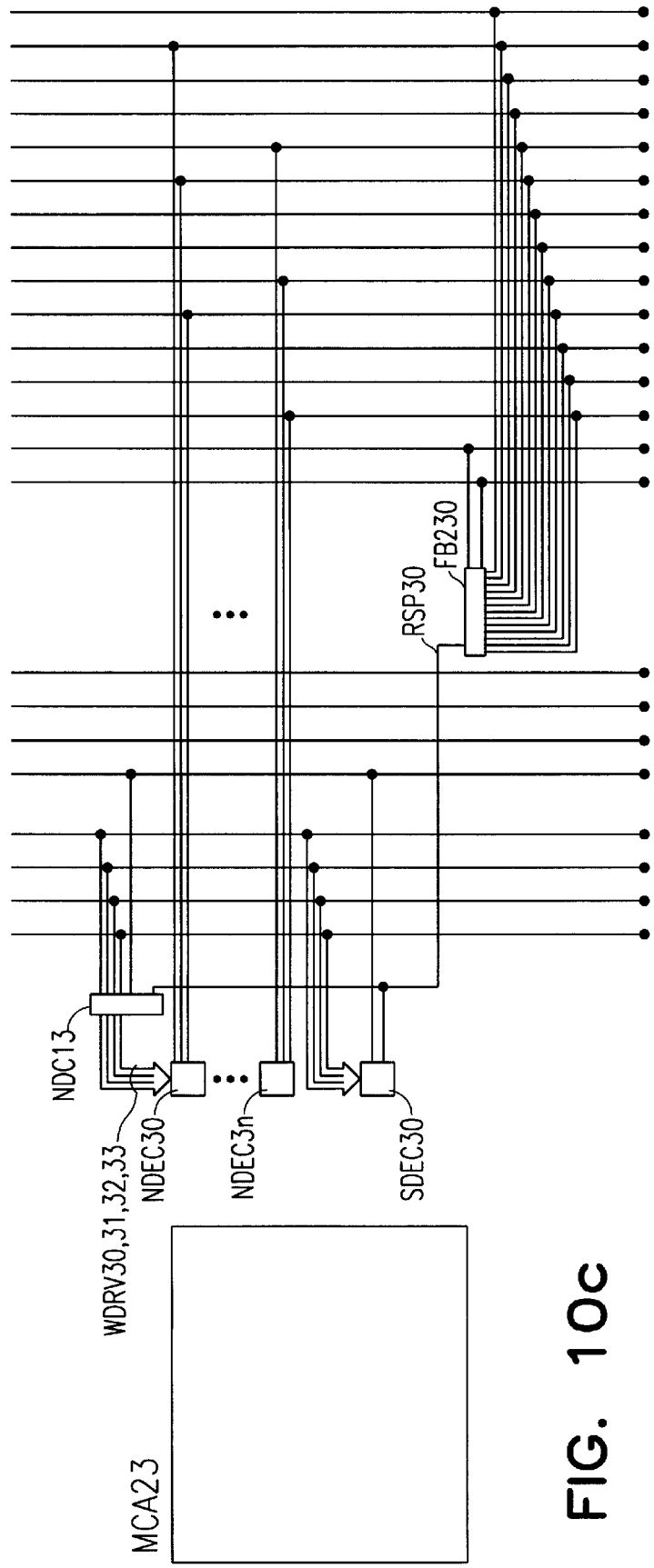

FIG. 10 is a block diagram illustrating a construction of the semiconductor memory device in the third embodiment.

Shown in the uppermost part of the block diagram of FIG. 10 is a memory cell array MCA20 including a plurality of normal memory cell blocks NCB00–NCB0n and one redundant memory cell blocks SCB00.

One end of the normal word lines WL00–WL03 is individually connected to the normal memory cell block NCB00, while the other end of the normal word lines WL00–03 is connected to the normal decoder NDEC00. Other normal memory cell blocks NCB01–NCB0n are connected via the normal word lines (marked with no symbol in the Figure) to other normal decoders NDEC01–NDEC0n.

Inputted to each of the normal decoders NDEC00–NDEC0n are one of address signals XA0–XA3, one of XB0–XB3 and one of XC0–XC3 corresponding to addresses of the normal memory cell blocks connected via the normal word lines WL00–WL03, . . . to the respective normal decoders NDEC00–NDEC0n. Inputted further thereto are word line drive signals WDRV00–WDRV03 transmitted from the normal decoder control circuit NDC10.

Inputted to the normal decoder control circuit NDC10 are the memory cell array selecting signal RSL0 and the redundancy indicating signal RSP00 from the redundant memory cell block selection fuse circuit block FB200.

One end of the redundant word lines SWL00–SWL03 is individually connected to the redundant memory cell block SCB00, while the other end of the redundant word lines SWL00–SWL03 is connected to the redundant decoder SDEC00.

Inputted to the redundant decoder SDEC00 are the word line drive signals WDRV0–WDRV3, the redundancy indicating signal RSP00 from the redundant memory cell block selection fuse circuit block FB200 and the memory cell array selecting signal RSL0.

A connecting relationship at the uppermost part of the block diagram has been explained so far, and every stage has a construction based on the same connecting relationship.

Figure 11:
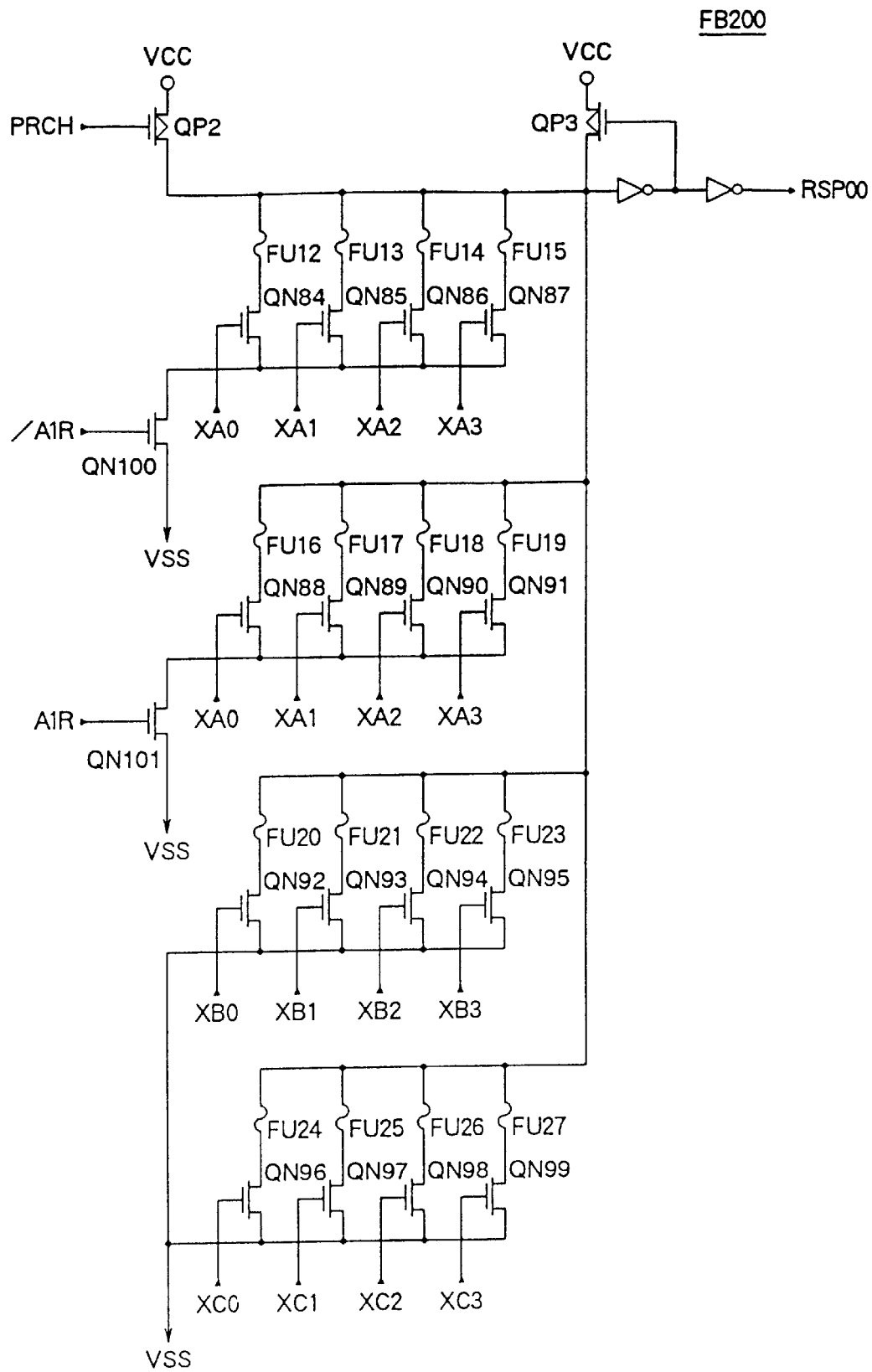
FIG. 11 is a circuit diagram illustrating a redundant memory cell block selection fuse circuit block in the semiconductor memory device in the third embodiment.

FIG. 11 is a circuit diagram showing a construction of the redundant memory cell block selection fuse circuit block FB200 in FIG. 10. Redundant memory cell block selection fuse circuit blocks FB210, FB220, FB230 have the same construction as the redundant memory cell block selection fuse circuit block FB200.

The redundant memory cell block selection fuse circuit block FB200 includes a P-type MOS transistor QP2 controlled by the signal PRCH and N-type MOS transistors QN84–QN91 for controlling signals from N-type MOS transistors QN100, QN101 controlled by address signals /A1R, A1R by use of the address signals XA0–XA3. The redundant memory cell block selection fuse circuit block FB200 further includes N-type MOS transistors QN92–QN95 controlled by address signals XB0–XB3 and N-type MOS transistors QN96–QN99 controlled by address signals XC0–XC3. The same block FB200 also includes a P-type MOS transistor QP3 controlled by a signal from the P-type MOS transistor QP2 and by signals from the N-type MOS transistors QN84–QN99 through fuses FU12–FU27 and inverters as well as. Accordingly, the redundancy indicating signal RSP00 conceived as an output signal of the redundant memory cell block selection fuse circuit block FB200 is controlled by the signals from the N-type MOS transistors QN84–QN99 as well as from the P-type MOS transistors QP2, QP3.

Figure 14:
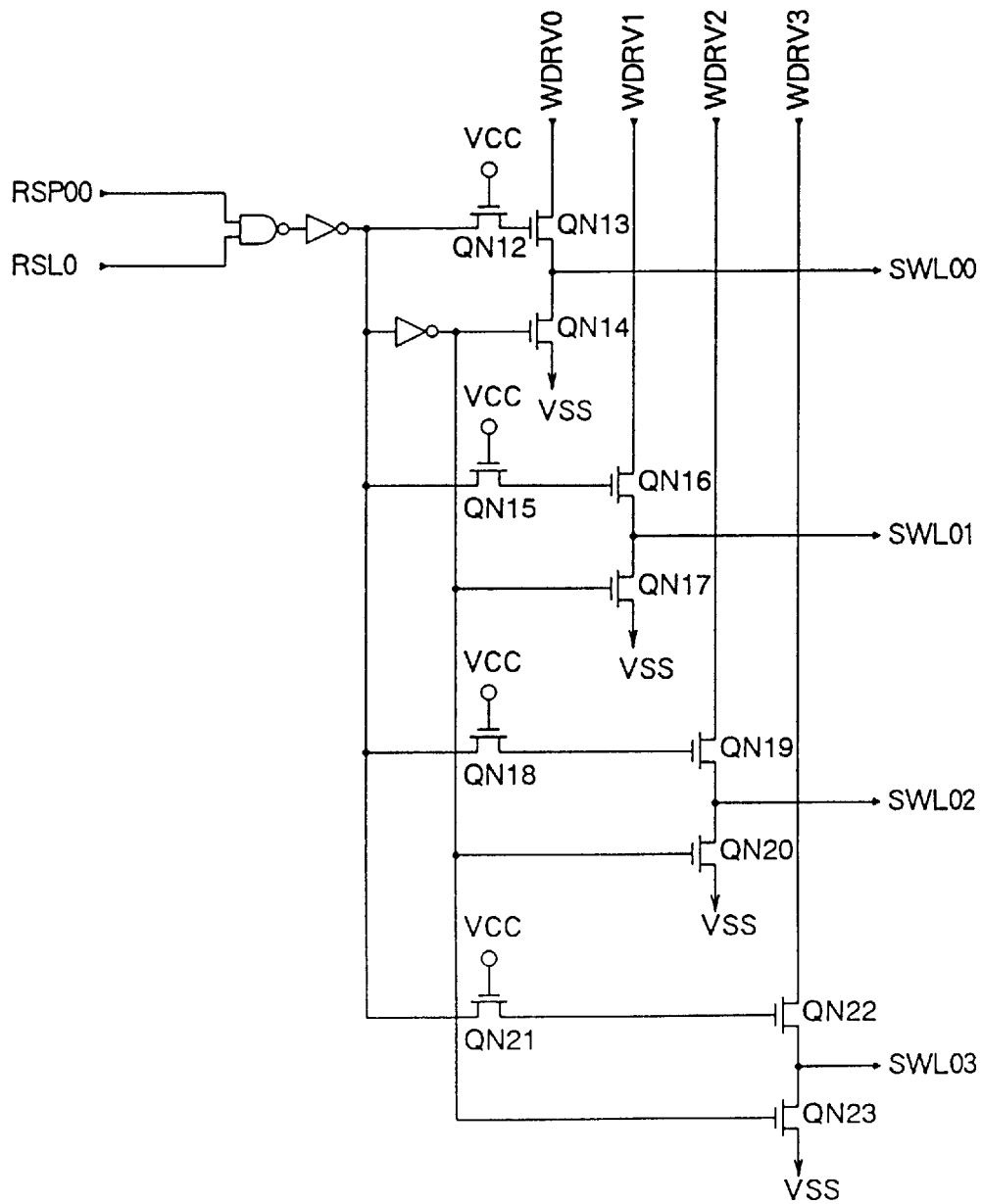
FIG. 14 is a circuit diagram of a redundant decoder in the semiconductor memory device in the prior art and in the third embodiment as well.
Figure 15:
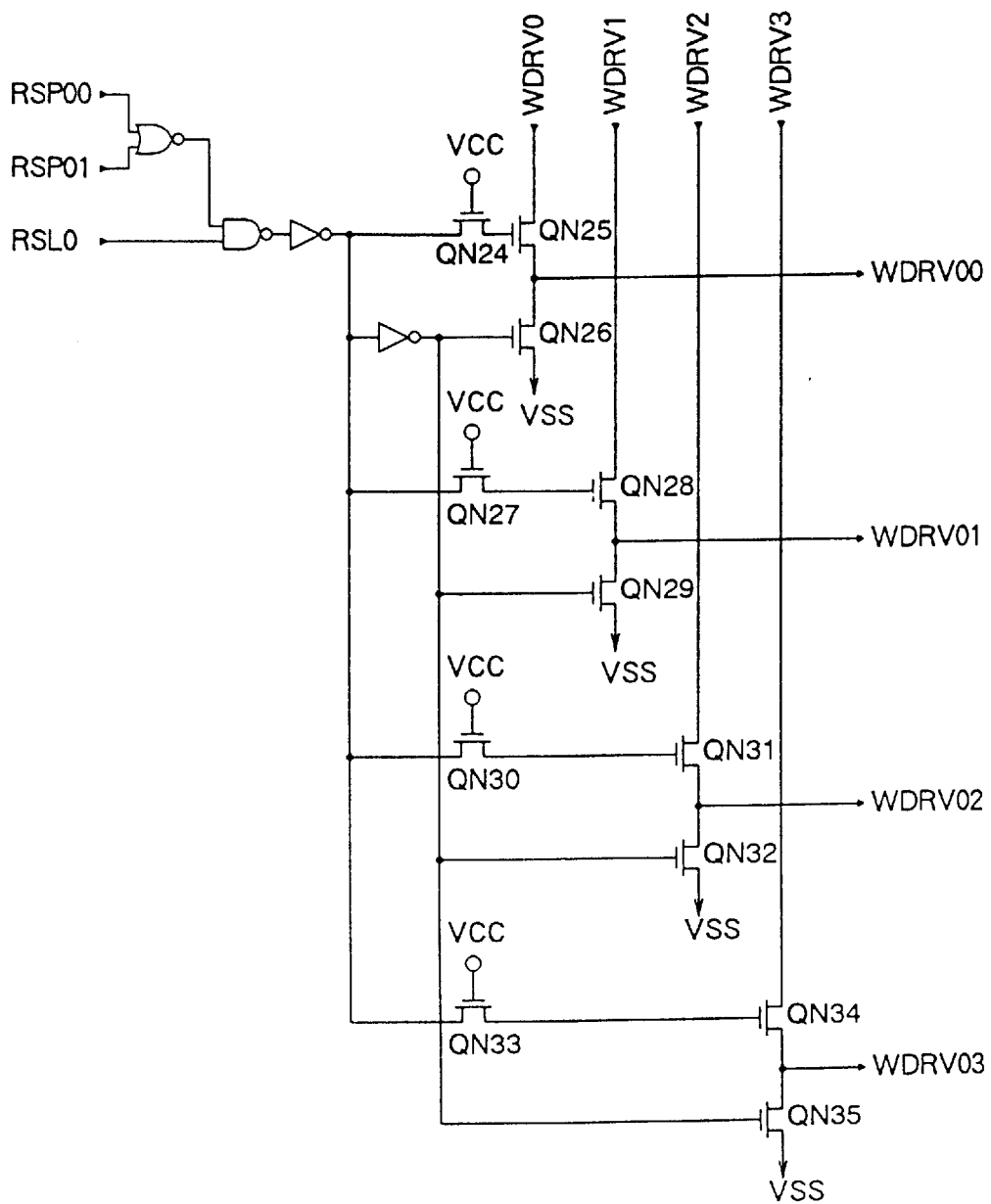
FIG. 15 is a circuit diagram showing a normal decoder control circuit in the semiconductor memory device in the prior art.

Redundant decoders SDEC00, SDEC10, SDEC20, SDEC30 in FIG. 10 have the same construction as the redundant decoder in the prior art shown in FIG. 14.

Inputted to the redundant decoders SDEC00, SDEC10, SDEC20, SDEC30 are signals from the NAND gate to which the redundancy indicating signal RSP00 and the memory cell array selecting signal RSL0.

The input signals respectively control N-type MOS transistors QN13, QN16, QN19, QN22 through N-type MOS transistors QN12, QN15, QN18, QN21 and also control N-type MOS transistors QN14, QN17, QN20, QN23 through the inverter. The word line drive signals WDRV0, WDRV1, WDRV2, WDRV3 control the redundant word lines SWL00, SWL01, SWL02, SWL03 respectively through the control of the N-type MOS transistors QN13 and QN14, QN16 and QN17, QN19 and QN20, QN22 and QN23.

Normal decoder control circuits NDC10–NDC13 in FIG. 10 have the same construction as the normal decoder control circuit in the first embodiment illustrated in FIG. 4.

Normal decoders NDEC00–NDEC0n, NDEC10–NDEC1n, NDEC20–NEC2n, NDEC30–NDEC3n in FIG. 10 have the same construction as the normal decoder in the prior art illustrated in FIG. 16.

Referring to FIGS. 10 and 11, the memory cell array MCA20 includes normal memory cell blocks NCB00–NCB0n and a redundant memory cell block SCB00. Memory cell arrays MCA21–MCA23 are other memory cell arrays having the same structure as the memory cell array MCA20. Shown therein are redundant memory cell block selection fuse circuit blocks FB200, FB210, FB220, FB230, redundant decoders SDEC00, SDEC10, SDEC20, SDEC30, normal decoders NDEC00–NDEC0n, NDEC10–NDEC1n, NDEC20–NDEC2n, NDEC30–NDEC3n, normal decoder control circuits NDC10, NDC11, NDC12, NDC13, address signals XA0–XA3, XB0–XB3, XC0–XC3, /A1R, A1R, memory cell array selecting signals RSL0–RSL3, word line drive signals WDRV0–WDRV3, normal word line drive signals WDRV00–WDRV03, WDRV10–WDRV13, WDRV20–WDRV23, WDRV30–WDRV33, normal word lines WL00, WL01, WL02, WL03, . . . , redundant word lines SWL00, SWL01, SWL02, SWL03, redundancy indicating signals RSP00, RSP10, RSP20, RSP30, a signal PRCH, a power supply voltage VCC, a ground voltage VSS and P-type MOS transistors QP2–QP3 and N-type MOS transistors QN84–QN101.

In accordance with a third embodiment, if the defective memory cell blocks are contained in the two adjacent normal memory cell blocks selected by the addresses with the same address signals with XC, XB being the same but only XA being different in the combinations of the addresses, memory cell elements corresponding to totally four normal word lines provided by twos among the normal word lines connected by fours to each of the two normal memory cell blocks can be replaced with one redundant memory cell bock having the four redundant word lines.

In accordance with the third embodiment, each memory cell array has, as in the prior art, a plurality of normal memory cell blocks each having four normal word lines. However, a different arrangement from the conventional configuration shown in FIG. 12 is that there is prepared a single piece of redundant memory cell block having the four redundant word lines, and the address signals /A1R, A1R are inputted to the redundant memory cell block selection fuse circuit block for selecting the redundant memory cell block. For example, the memory cell array MCA20 is provided with the normal memory cell blocks NCB00–NCB0n as in the prior art. However, there is prepared the single redundant memory cell block SCB00, and the address signals /A1R, A1R are inputted to the redundant memory cell block selection fuse circuit block FB200. Each normal decoder provided for each normal memory cell block controls the four normal word lines connected to each normal memory cell block. Each redundant decoder provided for each redundant memory cell block controls the four redundant word lines connected to each redundant memory cell block. The word line drive signals WDRV0–WDRV3 are partially decoded by the least significant bit A0R in the row address and the bit A1R that is just higher-order than A0R, and one of them is selected by a logic voltage of each of A0R, A1R, thus obtaining a predetermined word line potential. The arrangement is such that the address signals XA0–XA3 are partially decoded by the high-order bits A2R, A3R; the address signals XB0–XB3 are partially decoded by the higher-order bits A4R, A5R; and the address signals XC0–XC3 are partially decoded by the much higher-order bits A6R, A7R. The memory cell arrays are selected by the memory cell array selecting signals RSL0–RSL3. The normal memory cell blocks in the single memory cell array are selected by selecting the normal decoders with the address signals XA0–XA3, XB0–XB3, XC0–XC3. The normal word lines in the selected memory cell blocks are selected by the normal word line drive signals WDRV00–WDRV03, WDRV10–WDRV13, WDRV20–WDRV23, WDRV30–WDRV33 that are obtained when the word line drive signals WDRV0–WDRV3 are connected via the normal decoder control circuits to the respective normal decoders.

According to the above construction of the third embodiment of the present invention, for example, when making an attempt to replace, with the redundant memory cell block SCB00, the normal memory cell elements corresponding to the totally four normal word lines provided by twos in each of the two normal memory cell blocks selected by the address combinations with XC, XB being the same but only XA being different in the memory cell array MCA20, those normal memory cell elements are replaced with the redundant memory cell block by disconnecting the fuses corresponding to the respective addresses of the two blocks containing the defective memory cells in the redundant memory cell block selection fuse circuit block FB200, and that redundant memory cell block is thus used.

At this time, the fuses disconnected in the redundant memory cell block selection fuse circuit block FB200 are, because of XC, XB being the same but only XA being different in the two address combinations, totally four, i.e., one of the four fuses corresponding to the address signals XC0–XC3, one of the four fuses corresponding to XB0–XB3 and two of the eight fuses corresponding to XA0–XA3. In the disconnections of the fuses corresponding to the XA0–XA3, when replaced with the redundant memory cell block by combining the two normal word lines selected with A1R assuming "H" among the four normal word lines connected to the first normal memory cell block of the two normal memory cell blocks and the two normal word lines selected with /A1R assuming "H" among the four normal word lines connected to the second normal memory cell block thereof, there are disconnected the fuses corresponding to XA of the first normal memory cell block on the A1R side and to XA of the second normal memory cell block on the /A1R side.

Further, when disconnecting the fuses corresponding to the addresses with the same XA both on the A1R side and on the /A1R side in the redundant memory cell block selection fuse circuit block FB200, it follows that one normal memory cell block controlled by one normal decoder is replaced with the redundant memory cell block as in the prior art.

A circuit operation of the semiconductor memory adopting the method of replacing the defective memory cell in accordance with the third embodiment will hereinafter be described in detail with reference to FIGS. 10 through 14 and 4.

Herein, it is assumed that the memory cell array MCA20 among MCA20–MCA23 is selected. At first, in the redundant memory cell block selection fuse circuit block FB200 illustrated in FIG. 11, the signal PRCH is "L"; the P-type MOS transistor QP2 is ON; all the address signals A1R, /A1R, XA0–XA3, XB0–XB3, XC0–XC3 are "L"; the N-type MOS transistors QN8–QN101 are OFF; and the redundancy indicating signal RSP00 is "H". Further, all the memory cell array selecting signals RSL0–RSL3 are "L", and all the word line drive signals WDRV0–WDRV3 are "L". Accordingly, in the redundant decoders SDEC00 illustrated in FIG. 14, the redundant word lines SWL00–SWL03 are "L".

To begin with, the signal PRCH becomes "H", while the P-type MOS transistor QP2 is turned OFF. Subsequently, one of /A1R, A1R among the address signals becomes "H", while one of the N-type MOS transistors QN100, QN101 turned ON. Further, the memory cell array selecting signal RSL0 among RSL0–RSL3 that are all initially "L" becomes "H". Moreover, totally three address signals come to assume "H", i.e., one of the address signals XA0–XA3, one of XB0–XB3 and one of XC0–XC3, which have all been initially "L". Then, when those address signals are changed into addresses of the memory cell blocks to be selected, four transistors among sixteen N-type MOS transistors QN84–QN99 are turned ON.

At this time, if this address combination with "H" is not the combination of addresses of the blocks containing the defective memory cells in the memory cell array MCA20 and does not coincide with a combination of addresses corresponding to the fuses disconnected in the redundant memory cell block selection fuse circuit FB200 in the memory cell array MCA20, the redundancy indicating signal RSP00 becomes "L". Accordingly, even when the memory cell array selecting signal RSL0 becomes "H" in the redundant decoder SDEC00 shown in FIG. 14, the N-type MOS transistors QN13, QN16, QN19, QN22 are OFF, while the N-type MOS transistors QN14, QN17, QN20, QN23 are ON. Hence, all the redundant word lines SWL00–SWL03 remain to be "L" even when one arbitrary signal selected among the word line drive signals WDRV0–WDRV3 becomes a predetermined word line potential. That is, the redundant memory cell block SCB00 is not selected.

However, if the above address combination with "H" is the combination of addresses of the blocks containing the defective memory cells in the memory cell array MCA20, and if there are disconnected all the fuses corresponding the relevant addresses in the redundant memory cell block selection fuse circuit block FB200, the redundancy indicating signal RSP00 remains "H". Hence, when the memory cell array selecting signal RSL0 assumes "H" in the redundant decoder SDEC00 shown in FIG. 14, the N-type MOS transistors QN13, QN16, QN19, QN22 are ON, while the N-type MOS transistors QN14, QN17, QN20, QN23 are OFF. When one signal selected among the word line drive signals WDRV0–WDRV3 becomes a predetermined word line potential, this electric potential is transferred to the corresponding redundant word line. That is, the redundant memory cell block SCB00 is to be selected.

At this time, as described above, the redundant indicating signal RSP00 is "H", and, therefore, even when the memory cell array selecting signal RSL0 assumes "H" in the normal decoder control circuit NDC10 shown in FIG. 4, the N-type MOS transistors QN73, QN76, QN79, QN82 are OFF, while the N-type MOS transistors QN74, QN77, QN80, QN83 are ON. Hence, even when one arbitrary signal selected among the word line drive signals WDRV0–WDRV3 becomes a predetermined word line potential, all the normal word line drive signals WDRV00–WDRV03 remain "L", and all the normal memory cell blocks NCB00–NCB0n of the memory cell array MCA20 are not selected. Accordingly, it follows that the normal word lines selected by the address combination with "H" are replaced with the redundant word lines.

As discussed above, according to the semiconductor memory device based on the first construction of the present invention, it is feasible to select all the redundant memory cell blocks provided in the memory cell array through a less number of redundant memory cell block selection fuse circuit blocks than the number of the redundant memory cell blocks provided in one memory cell array. Therefore, an increase in the chip area can be restrained, and the redundant efficiency can be enhanced.

Further, according to the semiconductor memory device based on the second construction of the present invention, it is possible to select all the redundant memory cell blocks provided in the memory cell array through a smaller number of redundant memory cell block selection fuse circuit blocks than the number of the redundant memory cell blocks provided in one memory cell array. It is also possible to arbitrarily select the combination of the two normal memory cell blocks adjacent to each other that can be replaced with the two redundant memory cell blocks if there are prepared the two redundant memory cell blocks in the single memory cell array. Hence, an increase in the chip area can be restrained, and the redundant efficiency can be enhanced.

Moreover, according to the semiconductor memory device based on the third construction of the present invention, a lesser number of normal word lines than the number of the normal word lines connected to one normal memory cell block controlled by the single piece of normal decoder are set as the minimum replace unit. Even if there are the redundant memory cell block selection fuse circuit block and the redundant memory cell block provided by ones in one memory cell array, it is therefore possible to replace not only the single normal memory cell block controlled by one normal decoder but also a corresponding number of normal memory cell blocks to the number of the word lines possessed by one redundant memory cell block which blocks are selected from the plurality of normal memory cell blocks. Accordingly, an increase in the chip area can be restrained, and a degree of replacing freedom can be enhanced.

What is claimed is:

1. A semiconductor memory device comprising:
   a memory cell array including a plurality of normal memory cell blocks each having a plurality of normal word lines, and a plurality of redundant memory cell blocks each having a plurality of redundant word lines; and
   a redundant memory cell block selection fuse circuit block for replacing plural units of normal memory cells with one or more of said redundant memory cell blocks, each of said units of normal memory cells being controlled by a predetermined number of normal word lines among said normal word lines that control said normal memory cell blocks, the predetermined number being at least one,
   wherein the number of said redundant memory cell block selection fuse circuit blocks is less than the number of said units of normal memory cells to be replaced.

2. The semiconductor memory device according to claim 1, further comprising:
   normal decoders for controlling access to said normal memory cell blocks; and
   redundant decoders for controlling access to said redundant memory cell blocks.

3. The semiconductor memory device according to claim 1, wherein a total number of said normal word lines that control said plural units of normal memory cells is an integer multiple of the number of said redundant word lines that control one of said redundant memory cell blocks.

4. The semiconductor memory device according to claim 1, wherein said plural units of normal memory cells are arbitrarily selected from said normal memory cell blocks.

5. The semiconductor memory device according to claim 1, wherein said plural units of normal memory cells are selected from at least two of said normal memory cell blocks.

6. The semiconductor memory device according to claim 1, wherein said plural units of normal memory cells are selected from one of said normal memory cell blocks.

7. The semiconductor memory device according to claim 1, wherein said plural units of normal memory cells are a set of combinations, with each combination consisting of a first unit of normal memory cells and a second unit of normal memory cells that is adjacent to said first unit.

8. The semiconductor memory device according to claim 1, wherein each redundant memory cell block selection fuse circuit block stores addresses for at least two of the units of memory cells being replaced.

9. The semiconductor memory device according to claim 1, wherein each unit of normal memory cells includes at least as many memory cells as are contained in one of the normal memory cell blocks.

10. The semiconductor memory device according to claim 1, wherein the predetermined number is one.

11. The semiconductor memory device according to claim 1, wherein each normal memory cell block has four word lines and the predetermined number is four.

12. The semiconductor memory device according to claim 1, wherein the number of said redundant memory cell block selection fuse circuit blocks is less than the number of said redundant memory cell blocks.

13. A semiconductor memory device comprising:
    a memory cell array including a plurality of normal memory cell blocks and a plurality of redundant memory cell blocks;
    a redundant memory cell block selection fuse circuit block having a plurality of fuses that are disconnected corresponding to addresses of a plurality of defective normal memory cell blocks, in order to replace said plurality of defective normal memory cell blocks among said plurality of normal memory cell blocks with a part or all of said plurality of redundant memory cell blocks;
    a normal decoder for controlling accesses to said normal memory cell blocks: and
    a redundant decoder for controlling accesses to said redundant memory cell blocks,
    wherein a plurality of address combinations are allocated for each of said normal memory cell blocks, and
    an arrangement mode of the combinations of addresses allocated is an arrangement mode in which for any two adjacent ones of said normal memory cell blocks, the combination of addresses allocated to one of said adjacent normal memory cell blocks and the combination of addresses allocated to the other of said adjacent normal memory cell blocks are arranged so that only one bit of the plurality of address bits constituting each of the address combinations is invariably different in the address combinations of the two adjacent normal memory cell blocks.

14. The semiconductor memory device according to claim 13, wherein said plurality of defective normal memory cell blocks are replaced with a part or all of said plurality of redundant memory cell blocks by inputting redundant decoder selecting signals to said redundant decoder, the redundant decoder selecting signals being determined in accordance with the combination of addresses allocated to said normal memory cell blocks.

15. The semiconductor memory device according to claim 14, wherein when two adjacent ones of said normal memory cell blocks are replaced with two of said redundant memory cell blocks, said two adjacent normal memory cell blocks are replaced with said two redundant memory cell blocks by selecting common address bits among an address of one of said adjacent normal memory cell blocks and an address of the other of said adjacent normal memory cell blocks through disconnections of the fuses corresponding to the common address bits in said redundant memory cell block selection fuse circuit block, and by selecting the address bits that are different for said two adjacent normal memory cell blocks through disconnections of the two fuses among the plurality of fuses that correspond to the different address bits.

16. A semiconductor memory device comprising:
    a memory cell array including a plurality of normal memory cell blocks and a plurality of redundant memory cell blocks;
    a redundant memory cell block selection fuse circuit block having a plurality of fuses that are disconnected corresponding to addresses of a plurality of defective normal memory cell blocks, in order to replace said plurality of defective normal memory cell blocks among said plurality of normal memory cell blocks with a part or all of said plurality of redundant memory cell blocks;

a normal decoder for controlling accesses to said normal memory cell blocks; and a redundant decoder for controlling accesses to said redundant memory cell blocks, wherein the number of said redundant memory cell block selection fuse circuit blocks is less than the number of said redundant memory cell blocks.

17. A semiconductor memory device comprising;

a memory cell array including a plurality of normal memory cell blocks each having a plurality of normal word lines, and one or more redundant memory cell blocks each having a plurality of redundant word lines;

a redundant memory cell block selection fuse circuit block having a plurality of fuses that are disconnected corresponding to addresses of defective normal memory cell blocks, said redundant memory cell block selection fuse circuit block receiving an address bit that is lower-order than a least-significant address bit among normal memory cell block selection address bits, in order to replace an area containing the defective normal memory cells in said defective normal memory cell block among said plurality of normal memory cell blocks with a part or all of said one or more redundant memory cell blocks;

a normal decoder for controlling access to said normal memory cell blocks; and a redundant decoder for controlling access to said one or more redundant memory cell blocks.

18. The semiconductor memory device according to claim 17, wherein the areas are replaced with a part or all of one or more redundant memory cell blocks by selecting one or more of said normal word lines, which include the normal word lines that control the area containing the defective normal memory cells among said plurality of normal word lines connected to said defective normal memory cell blocks, by inputting normal word line selecting address bits that are lower-order than the least significant address bit among the normal memory cell block selection address bits to said redundant memory cell block selection fuse circuit block.

19. The semiconductor memory device according to claim 18, wherein when four of said normal word lines are connected to one normal memory cell block and four of said redundant word lines are connected to one redundant memory cell block, the respective areas controlled by first; second, third, and fourth normal word lines are replaced with said one redundant memory cell block by selecting a first normal word line that controls the area containing an edge portion of one of said normal memory cell blocks, a second normal word line that controls the consecutive area adjacent to the area containing the edge portion of said one normal memory cell block among said normal word lines connected to said one normal memory cell block, a third normal word line that controls the area containing an edge portion of another of said normal memory cell blocks, and a fourth normal word line that controls the consecutive area adjacent to the area containing the edge portion of said other normal memory cell block among said normal word lines connected to said other normal memory cell block.

20. The semiconductor memory device according to claim 19, wherein said other normal memory cell block is adjacent to said one normal memory cell block.

21. The semiconductor memory device according to claim 17, wherein there are provided the same number of said redundant memory cell block selection fuse circuit blocks as the number of said redundant memory cell blocks.

22. A semiconductor memory device comprising:

a memory cell array including a plurality of normal memory cell blocks and a plurality of redundant memory cell blocks;

a redundant memory cell block selection fuse circuit block having a plurality of fuses that are disconnected corresponding to addresses of a plurality of defective normal memory cell blocks, in order to replace said plurality of defective normal memory cell blocks among said plurality of normal memory cell blocks with a part or all of said plurality of redundant memory cell blocks;

a normal decoder for controlling accesses to said normal memory cell blocks; and a redundant decoder for controlling accesses to said redundant memory cell blocks, wherein said plurality of defective normal memory cell blocks are replaced with a part or all of said plurality of redundant memory cell blocks by inputting an address signal to said redundant decoder from said redundant memory cell block selection fuse circuit block with the fuses disconnected corresponding to the addresses of said plurality of defective normal memory cell blocks.

23. The semiconductor memory device according to claim 22, wherein the address signal inputted to said redundant decoder from said redundant memory cell block selection fuse circuit block is a signal of least-significant address bits among normal memory cell block selection address bits set in said redundant memory cell block selection fuse circuit block.

24. The semiconductor memory device according to claim 23, wherein when two adjacent ones of said normal memory cell blocks are replaced with two of said redundant memory cell blocks, said two adjacent normal memory cell blocks are replaced with said two redundant memory cell blocks by selecting common address bits among an address of one of said adjacent normal memory cell blocks and an address of the other of said adjacent normal memory cell blocks through disconnections of the fuses corresponding to the common address bits in said redundant memory cell block selection fuse circuit block, and by selecting the least-significant address bits, which are different for said two adjacent normal memory cell blocks, through disconnections of the two fuses among the plurality of fuses that correspond to the two different least-significant address bits.

* * * * *